United States Patent
Huang et al.

(10) Patent No.: US 11,721,637 B2
(45) Date of Patent: Aug. 8, 2023

(54) PATTERNING A TRANSPARENT WAFER TO FORM AN ALIGNMENT MARK IN THE TRANSPARENT WAFER

(71) Applicant: Taiwan Semiconductor Manufacturing Co., Ltd., Hsin-Chu (TW)

(72) Inventors: Xin-Hua Huang, Xihu Township (TW); Ping-Yin Liu, Yonghe (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 396 days.

(21) Appl. No.: 16/884,437

(22) Filed: May 27, 2020

(65) Prior Publication Data
US 2021/0375780 A1   Dec. 2, 2021

(51) Int. Cl.
| | | |
|---|---|---|
| *H01L 23/544* | (2006.01) | |
| *H01L 23/00* | (2006.01) | |
| *B23Q 17/22* | (2006.01) | |
| *H01L 21/18* | (2006.01) | |
| *H01L 21/68* | (2006.01) | |

(52) U.S. Cl.
CPC .......... *H01L 23/544* (2013.01); *H01L 24/83* (2013.01); *B23Q 17/22* (2013.01); *H01L 21/187* (2013.01); *H01L 21/681* (2013.01); *H01L 2223/54426* (2013.01); *H01L 2224/8313* (2013.01)

(58) Field of Classification Search
CPC .............. H01L 23/544; H01L 24/83; H01L 2223/54426; H01L 2224/8313; H01L 2223/54453; H01L 21/50; H01L 21/681; H01L 21/187
See application file for complete search history.

(56) References Cited

U.S. PATENT DOCUMENTS

2009/0220872 A1* 9/2009 Oishi ................. G03B 27/58
430/30
2012/0288995 A1   11/2012 El-Ghoroury et al.
(Continued)

OTHER PUBLICATIONS

"Refractive Index Database." The date of publication is unknown. Retrieved online on Mar. 6, 2020 from https://refractiveindex.info/.
(Continued)

*Primary Examiner* — Patricia D Valenzuela
(74) *Attorney, Agent, or Firm* — Eschweiler & Potashnik, LLC

(57) ABSTRACT

In some embodiments, the present disclosure relates to an integrated chip that includes bonding structure arranged directly between a first substrate and a second substrate. The first substrate includes a first transparent material and a first alignment mark. The first alignment mark is arranged on an outer region of the first substrate and also includes the first transparent material. The first alignment mark is defined by surfaces of the first substrate that are arranged between an uppermost surface of the first substrate and a lowermost surface of the first substrate. The second substrate includes a second alignment mark on an outer region of the second substrate. The second alignment mark directly underlies the first alignment mark, and the bonding structure is arranged directly between the first alignment mark and the second alignment mark.

20 Claims, 17 Drawing Sheets

(56) References Cited

U.S. PATENT DOCUMENTS

| | | | |
|---|---|---|---|
| 2015/0318326 A1 | 11/2015 | Martin et al. | |
| 2017/0326558 A1* | 11/2017 | Mahshid | B03C 5/005 |
| 2018/0286692 A1* | 10/2018 | Chen | H01L 21/3085 |
| 2019/0304852 A1* | 10/2019 | Seyama | H01L 22/12 |
| 2020/0381255 A1* | 12/2020 | Inamasu | H01L 21/67121 |

OTHER PUBLICATIONS

Yanjia, Chen. "Optical Measurement Technology." Nanyang Technological University, published in 2012.

\* cited by examiner

PATTERNING A TRANSPARENT WAFER TO FORM AN ALIGNMENT MARK IN THE TRANSPARENT WAFER

BACKGROUND

Many modern day electronic devices, such as digital cameras, televisions, and lasers, comprise optical circuits. Electronic devices that include optical circuits are often configured to receive or emit optical signals (e.g., light). Accordingly, in some applications, optical circuits may be formed on wafers that are transparent to allow optical signals (e.g., light) to travel through the wafer. Further, electronic devices comprising optical circuits may comprise multiple transparent wafers that are vertically stacked to reduce package size area on a printed circuit board. To achieve vertically stacked and bonded wafers, wafer surfaces may be prepared (e.g., etched, cleaned), aligned, and bonded to one another without damaging the device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
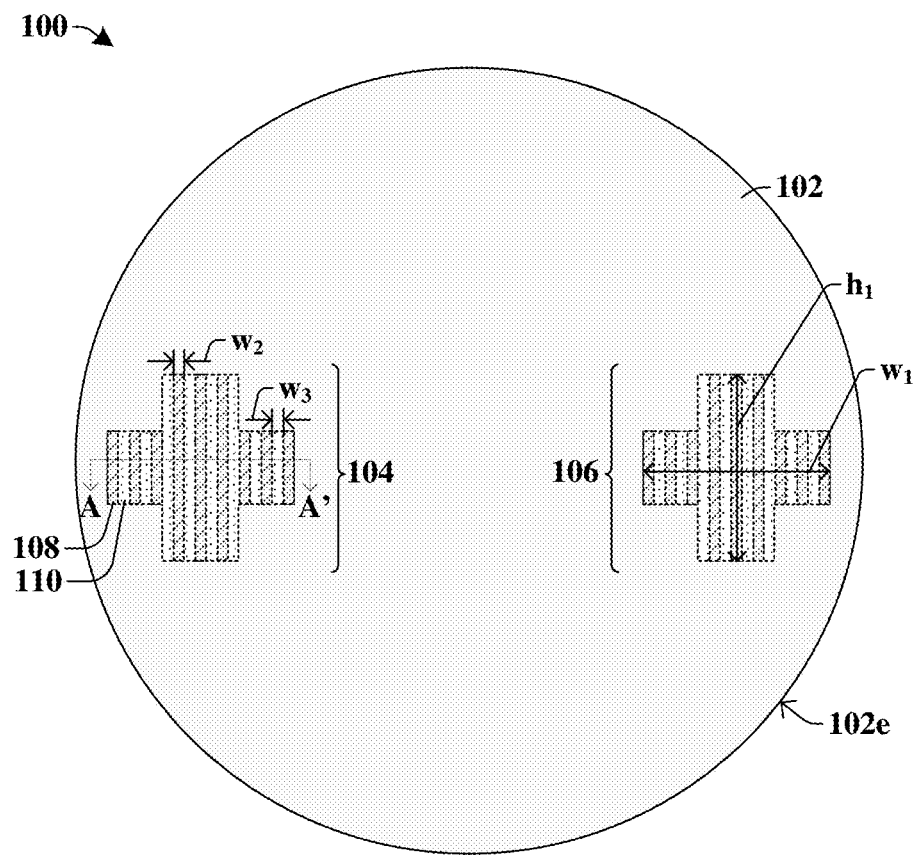
FIG. 1 illustrates a top-view of some embodiments of a transparent wafer comprising a first alignment mark and a second alignment mark that comprise the same material as the transparent wafer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some electronic devices that comprise image sensors, microelectromechanical systems (MEMS), silicon-on-insulator (SOI) substrates, or the like may comprise stacked wafers. Stacked wafers may be bonded to one another, wherein a first wafer is bonded to a second wafer. The first wafer and the second wafer may comprise the same or different materials. The first wafer may comprise at least a first alignment mark near an outer region of the first wafer, and the second wafer may comprise at least a second alignment mark near an outer region of the second wafer. In some embodiments, the first and second alignment marks may comprise metal contacts or metal wires. To bond the first wafer to the second wafer, an alignment method may be conducted first. In some embodiments, the first wafer is loaded onto a first wafer chuck, and the second wafer is loaded onto a second wafer chuck, wherein the first wafer faces the second wafer. A first camera may be used to locate the first alignment mark on the first wafer, and a second camera may be used to locate the second alignment mark on the second wafer. Based on the location of the first alignment mark and the second alignment mark, the first wafer chuck and the second wafer chuck may be moved by positioning circuitry such that the first alignment mark directly overlies, or is aligned with, the second alignment mark. Then, the first wafer may be moved towards and bonded to the second wafer.

However, in some embodiments, the first and/or second wafers may comprise transparent materials. For example, image sensors, digital cameras, lasers, or the like may comprise transparent materials to allow light to travel through the device. In such embodiments wherein the first wafer comprises a transparent material, metal contacts or metal wires may interference with the transparency of the first wafer. Further, forming metal contacts or metal wires on the first wafer for the purpose of a first alignment mark is costly and may not be the most effective material for the first alignment mark. For example, when the first alignment mark comprises a metal, the first camera often recognizes the first alignment mark with blurred edges, and thus, the precision and/or accuracy of the location of the first alignment mark may be reduced.

Various embodiments of the present disclosure relate to forming a first alignment mark on a first wafer that is transparent by patterning the first wafer such that the first alignment mark comprises surfaces arranged between a first surface (e.g., frontside or backside) of the first wafer and a second surface of the first wafer (e.g., backside or frontside). Thus, in such embodiments, the first alignment mark is formed by removing portions of the first wafer, instead of adding features to the first wafer, which saves materials and thus, reduces cost.

In some embodiments, to identify the first alignment mark during an alignment process, the first wafer is loaded onto a first wafer chuck that comprises a reflective material. Then, in such embodiments, a light source is applied to the first wafer and the first alignment mark may be located by the first camera. For example, light from the light source may reflect from the surfaces of the first alignment mark and from the first wafer chuck underlying, and such reflected light may destructively interfere, whereas light reflecting from the first surface of the first wafer and the first wafer chuck underlying the first surface of the first wafer may constructively interfere. Thus, the first camera may identify the first alignment mark based on the contrast between destructive interference and constructive interference when the first camera takes a picture of the first wafer under the light source.

In some embodiments, the first alignment mark may be designed to optimize the destructive interference such that the first camera may better recognize the boundary between the first alignment mark that is transparent and the first wafer that is transparent than if the first alignment mark were a metal contact or metal wire. Thus, in such embodiments wherein the first alignment mark is formed by removing portions of a first wafer that is transparent, the first alignment mark that is transparent may be more precisely located compared to a metal material resulting in a more reliable alignment of the first wafer to a second wafer and thus, in an overall more reliable device.

FIG. 1 illustrates a top-view 100 of some embodiments of a transparent wafer comprising a first alignment mark that is transparent and a second alignment mark that is transparent.

The top-view 100 of FIG. 1 includes a first alignment mark 104 and a second alignment mark 106 on a transparent wafer 102. In some embodiments, from the top-view 100, the first alignment mark 104 and the second alignment mark 106 may not be distinguishable from the transparent wafer 102 because the first alignment mark 104 and the second alignment mark 106 comprise a same material as the transparent wafer 102. Thus, the first and second alignment marks 104, 106 are illustrated with dotted lines in the top-view 100 of FIG. 1.

In some embodiments, from the top-view 100, the first alignment mark 104 is arranged on a first side of the transparent wafer 102, and the second alignment mark 106 is arranged on a second side of the transparent wafer 102. Overall, in some embodiments, the first alignment mark 104 and the second alignment mark 106 may be arranged on an outer region of the transparent wafer 102 and as close to an outer edge 102e of the transparent wafer 102 as possible. In some embodiments, manufacturing constraints affect how close each of the first and second alignment marks 104, 106 are to the outer edge 102e of the transparent wafer 102. For example, in some embodiments, if the first and second alignment marks 104, 106 are too close to the outer edge 102e of the transparent wafer 102, the transparent wafer 102 may break when forming the first and second alignment marks 104, 106. Because the first and second alignment marks 104, 106 are arranged near the outer edge 102e of the transparent wafer 102, the first and second alignment marks 104, 106 are less likely to interfere with circuitry and/or semiconductor devices arranged on the transparent wafer 102. Further, in some other embodiments, the transparent wafer 102 may comprise the first alignment mark 104 and not the second alignment mark 106, or the transparent wafer 102 may comprise more alignment marks than the first and second alignment marks 104, 106. In some embodiments, the first alignment mark 104 may have a same design as the second alignment mark 106.

In some embodiments, the first alignment mark 104 has an overall cross-like or plus-sign-like shape. In some embodiments, the first alignment mark 104 has a first height $h_1$ in a range of between approximately 20 micrometers and approximately 300 micrometers, for example. The first height $h_1$ may be equal to the maximum height of the first alignment mark 104. In some embodiments, the first alignment mark 104 has a first width $w_1$ in a range of between approximately 20 micrometers and approximately 300 micrometers, for example. In some embodiments, the first width $w_1$ may be about equal to the first height $h_1$. It will be appreciated that other values for the first height $h_1$ and the first width $w_1$ are also within the scope of this disclosure. Further, in some embodiments, the first alignment mark 104 may comprise first surfaces 108 and second surfaces 110 extending in parallel with one another. In such embodiments, the first surfaces 108 are arranged at a first depth (e.g., $d_1$ of FIG. 2) from a topmost surface of the transparent wafer 102 towards a bottommost surface of the transparent wafer 102, and the second surfaces 110 are arranged at a second depth (e.g., $d_2$ of FIG. 2) from the topmost surface of the transparent wafer 102 towards the bottommost surface of the transparent wafer 102. In some embodiments, each of the first surfaces 108 alternate with each of the second surfaces 110. It will be appreciated that although the first surfaces 108 and the second surfaces 110 are illustrated as different shading in FIG. 1, the first and second surfaces 108, 110 of the first alignment mark 104 and the transparent wafer 102 comprise a same material.

Further, in some embodiments, the first surfaces 108 have a second width $w_2$, and the second surfaces 110 have a third width $w_3$. In some embodiments, the second width $w_2$ may be in a range of between approximately 0.25 micrometers and approximately 1.5 micrometers. In some embodiments, the second width $w_2$ may be in a range of between approximately 0.55 micrometers and approximately 0.75 micrometers, for example. In some embodiments, the third width $w_3$ may be in a range of between approximately 0.25 micrometers and approximately 1.5 micrometers. In some embodiments, the third width $w_3$ may be in a range of between approximately 0.55 micrometers and approximately 0.75 micrometers, for example. In some embodiments, the second width $w_2$ may be about equal to the third width $w_3$. It will be appreciated that other values for the second width $w_2$ and the third width $w_3$ are also within the scope of this disclosure. In some embodiments, the second width $w_2$ and the third width $w_3$ are based on a wavelength of a light source used during alignment to locate the first alignment mark 104. In such embodiments, the relationship between the wavelength and the second and third width $w_2$, $w_3$ may improve the amount of destructive interference when the light source is applied to the first alignment mark 104, resulting in a more reliable identification of the first alignment mark 104 on the transparent wafer 102. It will be appreciated that in some embodiments, the second alignment mark 106 may have a same design as the first alignment mark 104, and thus the second alignment mark 106 may comprise the first surfaces 108 and the second surfaces 110.

Figure 2:
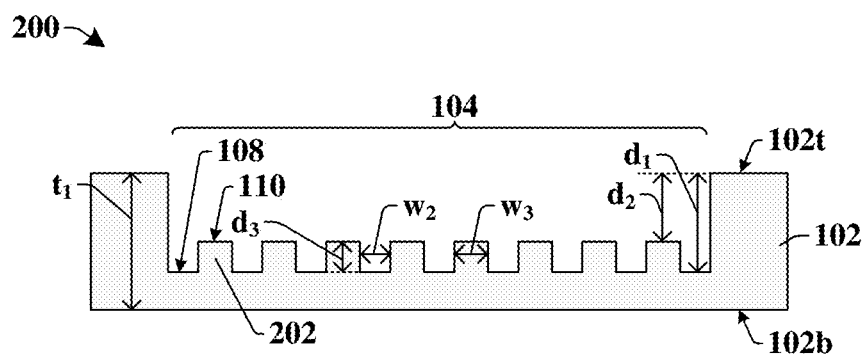
FIGS. 2-5 illustrates cross-sectional views of various embodiments of a first alignment mark comprising a transparent material on a transparent wafer comprising the transparent material.

FIG. 2 illustrates a cross-sectional view 200 of some embodiments of a first alignment mark. In some embodiments, the cross-sectional view 200 of FIG. 2 corresponds to cross-section line AA' of FIG. 1.

The cross-sectional view 200 of FIG. 2 shows how the first surfaces 108 of the first alignment mark 104 extend from a topmost surface 102$t$ of the transparent wafer 102 to a first depth $d_1$, in some embodiments. Further, in some embodiments, the second surfaces 110 may extend from the topmost surface 102$t$ of the transparent wafer 102 to a second depth $d_2$. In some embodiments, the second depth $d_2$ is less than the first depth $d_1$. Further, the first surfaces 108 and the second surfaces 110 of the first alignment mark 104 are arranged between the topmost surface 102$t$ of the transparent wafer 102 and a bottommost surface 102$b$ of the transparent wafer 102.

In some other embodiments, from the cross-sectional view 200 of FIG. 2, the first alignment mark 104 may be described as comprising first protrusions 202 that protrude from first surfaces 108 of the first alignment mark 104. The first protrusions 202 may have upper surfaces defined by the second surfaces 110 of the first alignment mark 104, in some embodiments. Further, the first protrusions 202 may each have the third width $w_3$ and be spaced apart from one another by the second width $w_2$. In some embodiments, the first protrusion 202 protrude from the first surfaces 108 to a third distance $d_3$. The third distance $d_3$ is equal to the difference between the first depth $d_1$ of the first surfaces 108 and the second depth $d_2$ of the second surfaces 110. In some embodiments, the third distance $d_3$ is in a range of between, for example, approximately 0.25 micrometers and approximately 1.5 micrometers. In some embodiments, the third distance $d_3$ may be in a range of between approximately 0.55 micrometers and approximately 0.75 micrometers, for example. It will be appreciated that other values for the second depth $d_2$ and the third distance $d_3$ may also be in the scope of this disclosure. Thus, in some embodiments, the third distance $d_3$ is about equal to the second width $w_2$ and the third width $w_3$. In some embodiments, the third distance $d_3$, the second width $w_2$, and the third width $w_3$ are based on a wavelength of the light source used to identify the first alignment mark 104. For example, in some embodiments, the third distance $d_3$, the second width $w_2$, and the third width $w_3$ may equal the wavelength of the light source.

In some embodiments, the transparent wafer 102 comprises a transparent material, such as, for example, fused silica or some other suitable glass material that allows a majority of light to transmit through the transparent wafer 102. Further, in some embodiments, the transparent wafer 102 has a first thickness $t_1$ that is in a range of between, for example, approximately 200 micrometers and approximately 750 micrometers. It will be appreciated that other values of the first thickness $t_1$ may also be within the scope of this disclosure.

Figure 3:
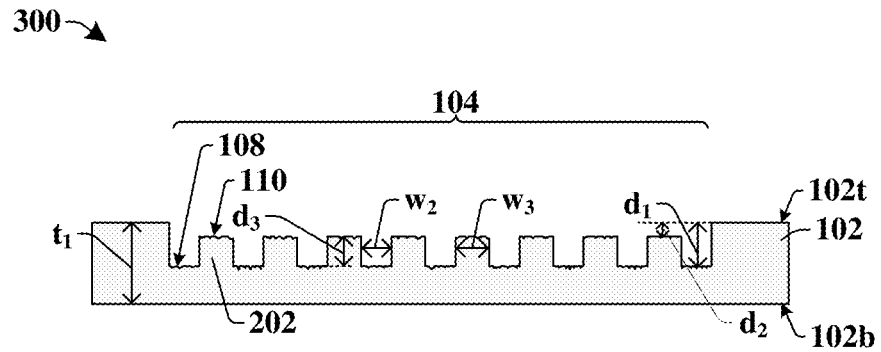

FIG. 3 illustrates a cross-sectional view 300 of some alternative embodiments of the first alignment mark 104.

In some embodiments, the first alignment mark 104 is formed using various steps of photolithography and removal (e.g., etching) processes. Thus, in some embodiments, the first surfaces 108 and the second surfaces 110 of the first alignment mark 104 may have a first average surface roughness and a second average surfaces roughness, respectively. The first and second average surface roughnesses may be greater than a third average surface roughness of the topmost surface 102$t$ of the transparent wafer 102, in some embodiments. In some embodiments, to measure average surface roughness, a roughness measurement tool (e.g., a profilometer, atomic force microscopy (AFM)) calculates a mean line along a surface and measures the deviation between the height of a peak or valley on the surface from the mean line. After measuring many deviations at many peaks and valleys throughout the surface, the average surface roughness is calculated by taking the mean of the many deviations, where the deviations are absolute values. In other embodiments, the surface roughness is quantified by measuring a total thickness variation (TTV). The TTV of a layer is the difference between the smallest thickness and the largest thickness of the layer. The TTV is measured throughout the length of a layer.

Figure 4:
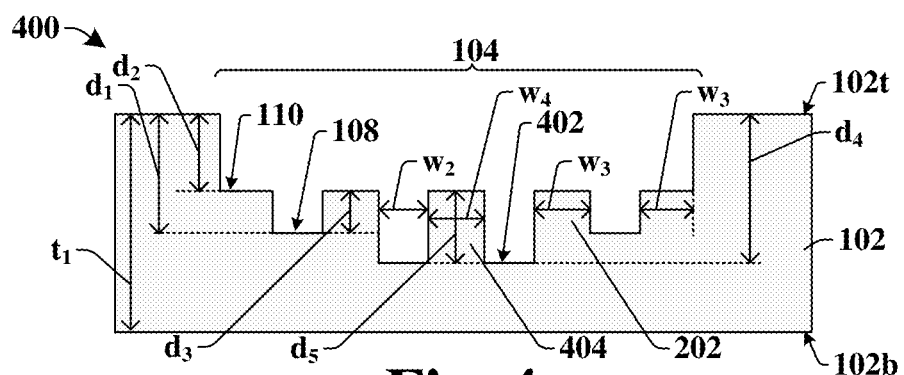

FIG. 4 illustrates a cross-sectional view 400 of some other alternative embodiments of the first alignment mark 104.

In some embodiments, the first alignment mark 104 may comprise more than the first surfaces 108 and the second surfaces 110. For example, as shown in the cross-sectional view 400 of FIG. 4, in some embodiments, the first alignment mark 104 may further comprise a third surface 402. In some embodiments, the third surface 402 may be arranged below the first and second surfaces 108, 110 of the first alignment mark 104 and between the topmost surface 102$t$ and the bottommost surface 102$b$ of the transparent wafer 102. In some embodiments, the third surface 402 may extend from the topmost surface 102$t$ of the transparent wafer 102 to a fourth depth $d_4$. In some embodiments, a difference between the second depth $d_2$ and the fourth depth $d_4$ may be equal to a fifth distance $d_5$. In such embodiments, the fifth distance $d_5$ may be in a range of between, for example approximately 0.5 micrometers and approximately 3 micrometers. In some embodiments, the fifth distance $d_5$ may be in a range of between approximately 1.1 micrometers and approximately 1.3 micrometers. It will be appreciated that other values of the fifth distance $d_5$ are also within the scope of this disclosure. Thus, in some embodiments, the fifth distance $d_5$ may be greater than the third distance $d_3$. For example, in some embodiments, the fifth distance $d_5$ may be equal to about two times or some other integer multiple of the third distance $d_3$.

In some embodiments, from the cross-sectional view 400 of FIG. 4, the first alignment mark 104 may be described as comprising a second protrusion 404 that protrudes from the third surface 402 of the first alignment mark 104. In some embodiments, the second protrusion 404 may have an upper surface defined by one of the second surfaces 110. In other embodiments, the second protrusion 404 may have an upper surface defined by some other surface than one of the second surfaces 110. In some embodiments, the second protrusion 404 protrudes from the third surface 402 of the first alignment mark 104 and towards the topmost surface of the transparent wafer 102 to the fifth distance $d_5$. Further, in some embodiments, the second protrusion 404 may be arranged beside one of the first protrusions 202. In some embodiments, the second protrusion 404 is spaced apart from the one of the first protrusions 202 by the second width $w_2$. Further, in some embodiments, the second protrusion 404 has a fourth width $w_4$. In some embodiments, the fourth width $w_4$ is in a range of between, for example, approximately 0.25 micrometers and approximately 1.5 micrometers. In some embodiments, the fourth width $w_4$ may be in a range of between approximately 0.55 micrometers and approximately 0.75 micrometers, for example. It will be appreciated that other values of the fourth width $w_4$ are also within the scope of this disclosure. In some embodiments, the fourth width $w_4$ of the second protrusion 404 may be about equal to the third width $w_3$ of the first protrusions. It will be appreciated that the total number of first surfaces 108, the total number of second surfaces 110, the total number of first protrusions 202, and the total number of second protrusions 404 present in the first alignment mark 104 may vary, and embodiments of the first alignment mark 104 with different total numbers of first surfaces 108, second surfaces 110, first protrusions 202, and second protrusions 404 are also within the scope of the disclosure.

Figure 5:
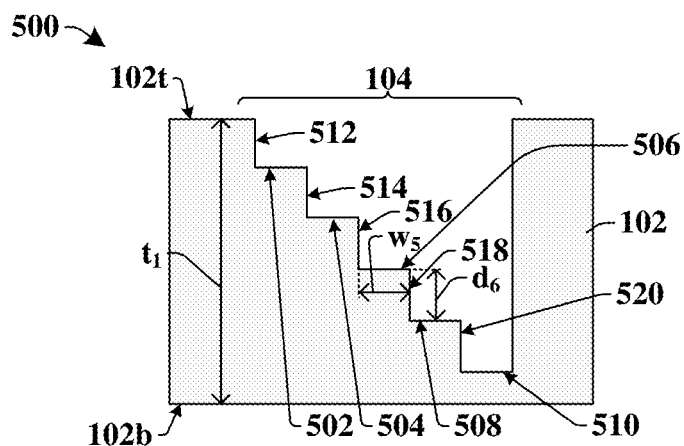

FIG. 5 illustrates a cross-sectional view 500 of yet some other alternative embodiments of the first alignment mark 104.

In some embodiments, the first alignment mark 104 has an overall "stair-step-like" profile from the cross-sectional view 500. In such embodiments, the first alignment mark 104 may comprise: a first surface 502 that is arranged below the topmost surface 102t of the transparent wafer 102, a second surface 504 that is arranged below the first surface 502, a third surface 506 that is arranged below the second surface 504, a fourth surface 508 that is arranged below the third surface 506, and a fifth surface 510 that is arranged below the fourth surface 508 and above the bottommost surface 102b of the transparent wafer 102. It will be appreciated that the first alignment mark 104 may comprise more or less than the first through fifth surfaces 502, 504, 506, 508, 510 in other embodiments. In some embodiments, the first, second, third, fourth, and fifth surfaces 502, 504, 506, 508, 510 of the first alignment mark 104 may extend to a fifth width $w_5$. In some embodiments, the fifth width $w_5$ may be in a range of between, for example, approximately 0.25 micrometers and approximately 1.5 micrometers. In some embodiments, the fifth width $w_5$ may be in a range of between approximately 0.55 micrometers and approximately 0.75 micrometers, for example. It will be appreciated that other values of the fifth width $w_5$ are also within the scope of this disclosure. In other embodiments, the fifth width $w_5$ may vary amongst the first, second, third, fourth, and fifth surfaces 502, 504, 506, 508, 510 of the first alignment mark 104.

Further, in some embodiments, the first alignment mark 104 comprises: a first sidewall 512 that couples the topmost surface 102t of the transparent wafer 102 to the first surface 502 of the first alignment mark, a second sidewall 514 that couples the first surface 502 to the second surface 504, a third sidewall 516 that couples the second surface 504 to the third surface 506, a fourth sidewall 518 that couples the third surface 506 to the fourth surface 508, and a fifth sidewall 520 that couples the fourth surface 508 to the fifth surface 510. In some embodiments, each of the first, second, third, fourth, and fifth sidewalls 512, 514, 516, 518, 520 have a height that equals a sixth distance $d_6$. In some embodiments, the sixth distance $d_6$ may be about equal to the fifth width $w_5$. In some embodiments, the sixth distance $d_6$ may be in a range of between, for example, approximately 0.25 micrometers and approximately 1.5 micrometers. In some embodiments, the sixth distance $d_6$ may be in a range of between approximately 0.55 micrometers and approximately 0.75 micrometers, for example. It will be appreciated that other values of the sixth distance $d_6$ are also within the scope of this disclosure. In other embodiments, the first, second, third, fourth, and fifth sidewalls 512, 514, 516, 518, 520 may have different heights from one another.

FIGS. 6, 7, 8, and 9 illustrate top-views 600, 700, 800, and 900, respectively, of some alternative embodiments of first and second alignment marks 104, 106 that are transparent and arranged on a transparent wafer 102.

Figure 6:
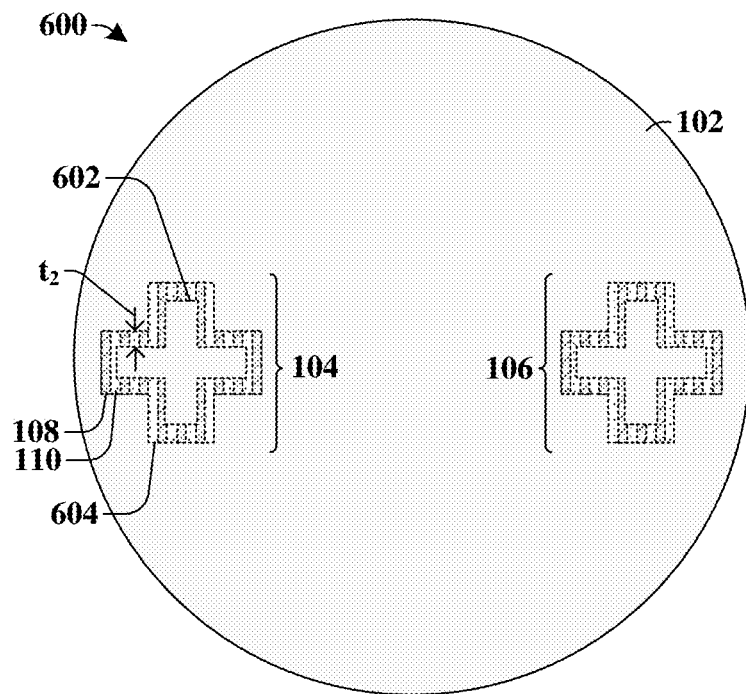
FIGS. 6-9 illustrate top-views of alternative embodiments of a transparent wafer comprising a first alignment mark and a second alignment mark that comprise the same material as the transparent wafer.

As illustrated in the top-view 600 of FIG. 6, in some embodiments, the first and second alignment marks 104, 106 may exhibit overall cross-like shapes in a ring-like configuration. For example, in some embodiments, the first alignment mark 104 comprises an inner perimeter 602 and an outer perimeter 604, and thus, may be in a ring-like configuration. Further, the inner perimeter 602 and the outer perimeter 604 of the first alignment mark 104 may each exhibit a cross-like shape, in some embodiments. In some embodiments, the inner perimeter 602 is spaced apart from the outer perimeter 604 by a second thickness t2. In some embodiments, the first alignment mark 104 comprises the first and second surfaces 108, 110, as described with respect to the cross-sectional views 200 and 300, for example. In some other embodiments, the first alignment mark 104 may comprise more than the first and second surfaces 108, 110.

Figure 7:
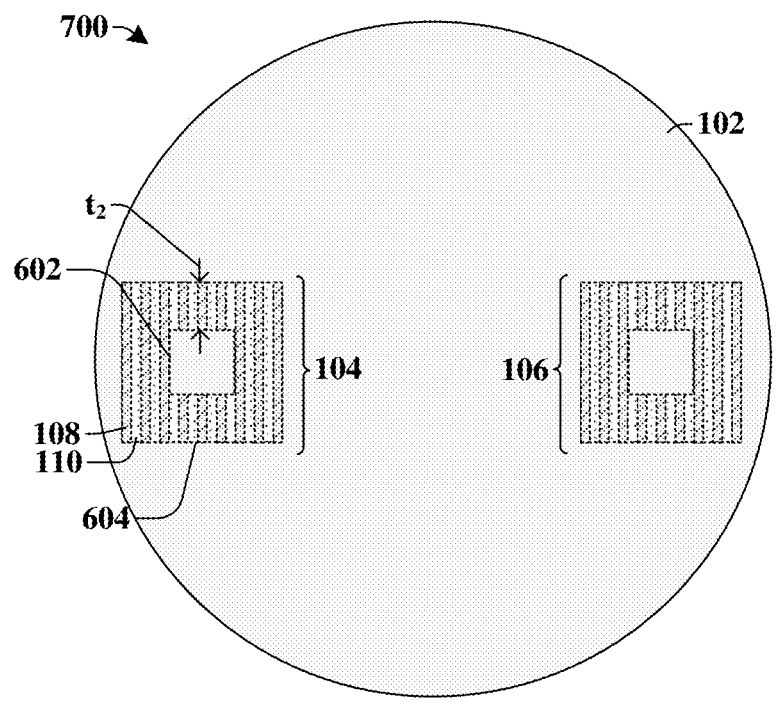

As illustrated in the top-view 700 of FIG. 7, in some embodiments, the first and second alignment marks 104, 106 may exhibit overall square-like shapes in a ring-like configuration. Thus, in some embodiments, the inner perimeter 602 of the first alignment mark 104 is a square, and the outer perimeter 604 of the first alignment mark 104 is a square. It will be appreciated that the inner perimeter 602 and the outer perimeter 604 may exhibit other shapes in other embodiments.

Figure 8:
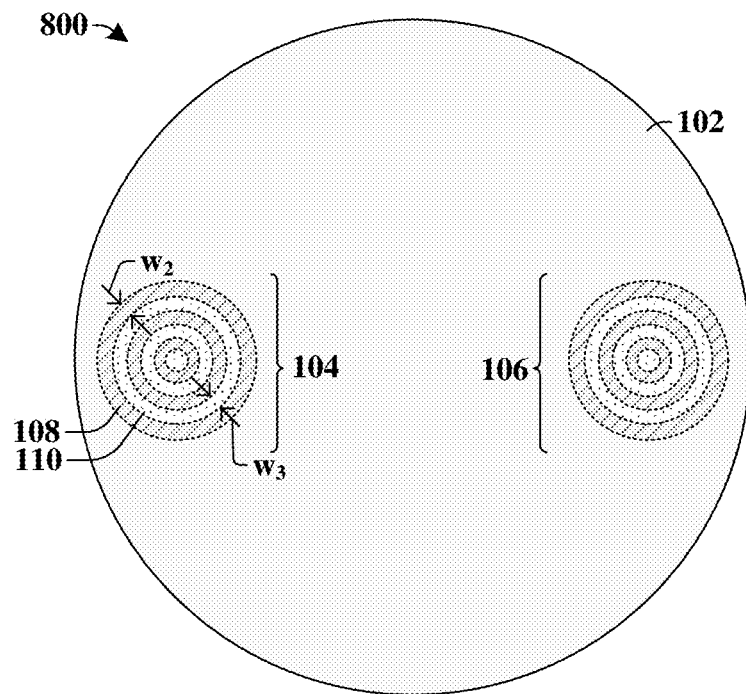

As illustrated in the top-view 800 of FIG. 8, in some embodiments, the first and second alignment marks 104, 106 may exhibit overall circular-like shapes. Further, in some embodiments, the first surfaces 108 extend in parallel with the second surfaces 110, whereas in other embodiments, the first surfaces 108 of the first alignment mark 104 and the second surfaces 110 of the first alignment mark 104 may be arranged in concentric circles. In such embodiments, the first surfaces 108 may still have the second width $w_2$, and the second surfaces 110 may still have the third width $w_3$ from a cross-sectional view perspective.

Figure 9:
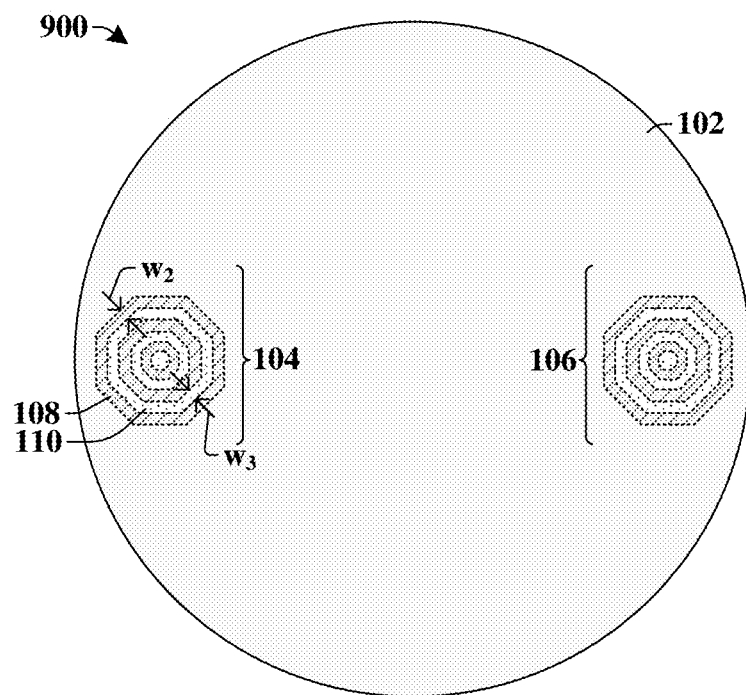

As illustrated in the top-view 900 of FIG. 9, in some embodiments, the first and second alignment marks 104, 106 may exhibit overall octagon-like shapes. Further, in some embodiments, the first surfaces 108 extend in parallel with the second surfaces 110, whereas in other embodiments, the first surfaces 108 of the first alignment mark 104 and the second surfaces 110 of the first alignment mark 104 may be arranged in concentric octagons. In such embodiments, the first surfaces 108 may still have the second width $w_2$, and the second surfaces 110 may still have the third width $w_3$ from a cross-sectional view perspective.

It will be appreciated that in the first and second alignment marks 104, 106 may comprise other overall shapes and/or designs. For example, in some embodiments, the first and second alignment marks 104, 106 may exhibit triangles, ovals, stars, or some other polygon from the perspective of the top-view 900, and that the first and second alignment marks 104, 106 may comprise more than the first and second surfaces 108, 110.

Figure 10:
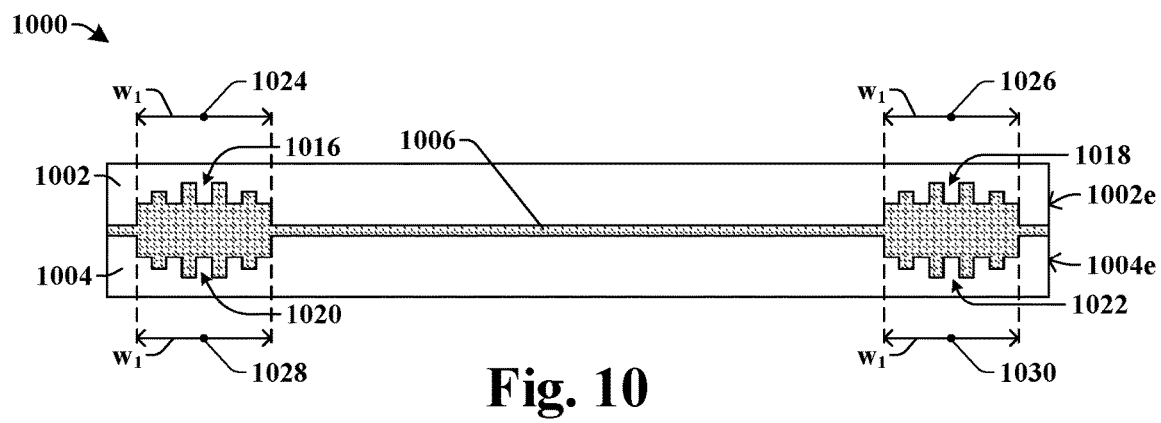
FIGS. 10 and 11 illustrate cross-sectional views of some embodiments of a first wafer that comprises a transparent material and comprises a first alignment mark comprising the transparent material bonded to a second wafer.

FIG. 10 illustrates a cross-sectional view 1000 of some embodiments of a first wafer bonded to a second wafer, and a first alignment mark of the first wafer directly overlying a first alignment mark of the second wafer.

In some embodiments, the cross-sectional view 1000 includes a first wafer 1002 that comprises a first transparent material is bonded to a second wafer 1004 that comprises a second transparent material. In some embodiments, the first and/or second transparent materials may be or comprise fused silica or some other suitable glass material. In some embodiments, the first and/or second wafers 1002, 1004 may be bonded to one another prior to the formation of circuitry and/or semiconductor devices on the first and/or second wafers 1002, 1004, whereas in other embodiments, the first and/or second wafers 1002, 1004 may be bonded to one another after the formation of circuitry and/or semiconductor devices on the first and/or second wafers 1002, 1004.

In some embodiments, the first wafer 1002 comprises a first alignment mark 1016 and second alignment mark 1018, and the second wafer 1004 comprises a third alignment mark 1020 and a fourth alignment mark 1022. In some embodiments, the first, second, third, and fourth alignment marks 1016, 1018, 1020, 1022 may comprise a same design (e.g., dimensions, material, cross-sectional view, etc.), whereas in other embodiments, the first, second, third, and fourth alignment marks 1016, 1018, 1020, 1022 may comprise different designs. In some embodiments, the first, second, third, and/or fourth alignment marks 1016, 1018, 1020, 1022 may have designs that correspond to, for example, the first alignment mark 104 of FIGS. 1-9. In some embodiments, the first and second alignment marks 1016, 1018 comprise the first transparent material, and the third and fourth alignment marks 1020, 1022 comprise the second transparent material. The first wafer 1002 may be bonded to the second wafer 1004 using a bonding structure 1006, in some embodiments. In such embodiments, the bonding structure 1006 may be or comprise a transparent epoxy or some other suitable transparent glue material. It will be appreciated that other materials for the bonding structure 1006 are also within the scope of this disclosure. In some embodiments, the bonding structure 1006 may comprise one or more materials and/or layers. Further, in some embodiments, the bonding structure 1006 directly contacts the first, second, third, and fourth alignment marks 1016, 1018, 1020, 1022.

In some embodiments, the first alignment mark 1016 of the first wafer 1002 directly overlies and is aligned with the third alignment mark 1020 of the second wafer 1004. In other words, the first alignment mark 1016 may have the first width $w_1$; the third alignment mark 1020 may also have the first width $w_1$; and a first midpoint 1024 of the first alignment mark 1016 may directly overlie a third midpoint 1028 of the third alignment mark 1020. Further, in some embodiments, the second alignment mark 1018 of the first wafer 1002 directly overlies and is aligned with the fourth alignment mark 1022 of the second wafer 1004. In other words, the second alignment mark 1018 may have the first width $w_1$; the fourth alignment mark 1022 may also have the first width $w_1$; and a second midpoint 1026 of the second alignment mark 1018 may directly overlie a fourth midpoint 1030 of the fourth alignment mark 1022. In some embodiments, the first midpoint 1024, the second midpoint 1026, the third midpoint 1028, and the fourth midpoint 1030 are defined as the midpoints of the first widths $w_1$ of the first alignment mark 1016, the second alignment mark 1018, the third alignment mark 1020, and the fourth alignment mark 1022, respectively. In other embodiments, it will be appreciated that alignment of the first alignment mark 1016 to the third alignment mark 1020 and alignment of the second alignment mark 1018 to the fourth alignment mark 1022 may be based on the alignment of features other than the first, second, third and fourth midpoints 1024, 1026, 1028, 1030. Nevertheless, in some embodiments, when the first alignment mark 1016 is aligned with the third alignment mark 1020 and when the second alignment mark 1018 is aligned with the fourth alignment mark 1022, a first edge 1002e of the first wafer 1002 directly overlies or is aligned with a second edge 1004e of the second wafer 1004. Thus, alignment of the first wafer 1002 to the second wafer 1004 may depend on the detectability of the first, second, third, and fourth alignment marks 1016, 1018, 1020, 1022.

Figure 11:
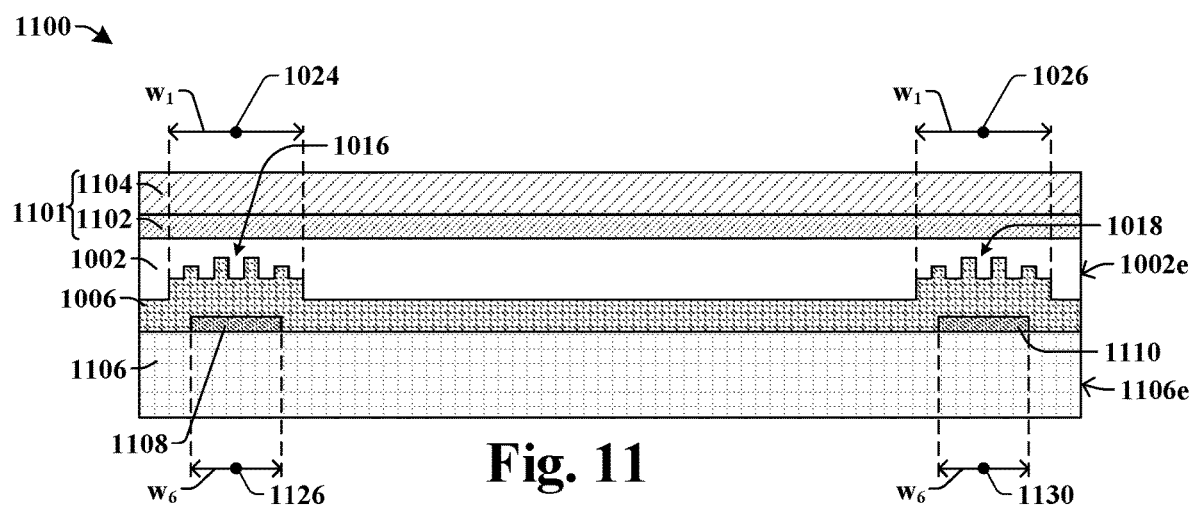

FIG. 11 illustrates a cross-sectional view 1100 of some embodiments of a first wafer that is transparent bonded to a third wafer that is not transparent.

In some embodiments, the first wafer 1002 that comprises the first transparent material may be bonded to a third wafer 1106 that is not transparent. For example, in some embodiments, the third wafer 1106 be or comprise any type of semiconductor body (e.g., silicon/CMOS bulk, SiGe, silicon on insulator (SOI), etc.) such as a semiconductor wafer or one or more die on a wafer, as well as any other type of semiconductor and/or epitaxial layers formed thereon and/or otherwise associated therewith.

In such embodiments, the third wafer 1106 may comprise a first metal alignment mark 1108 and a second metal alignment mark 1110 that directly underlie and are aligned with the first alignment mark 1016 and the second alignment mark 1018, respectively, of the first wafer 1002. Thus, in some embodiments, a transparent alignment mark (e.g., 1016, 1018) may be bonded to a metal alignment mark (e.g., 1108, 1110). In some embodiments, the first and second metal alignment marks 1108, 1110 may each have a sixth width w6. In some embodiments, alignment of the first alignment mark 1016 to the first metal alignment mark 1108 may mean that the first midpoint 1024 of the first alignment mark 1016 directly overlies a fifth midpoint 1126 of the first metal alignment mark 1108. Similarly, in some embodiments, alignment of the second alignment mark 1018 to the second metal alignment mark 1110 may mean that the second midpoint 1026 of the second alignment mark 1018 directly overlies a sixth midpoint 1130 of the second metal alignment mark 1110. Nevertheless, in some embodiments, when the first alignment mark 1016 is aligned with the first metal alignment mark 1108 and when the second alignment mark 1018 is aligned with the second metal alignment mark 1110, a first edge 1002e of the first wafer 1002 directly overlies or is aligned with a third edge 1106e of the third wafer 1106. In such embodiments, the bonding structure 1006 may be used to bond the first wafer 1002 to the third wafer 1106.

Further, in some embodiments, an active layer structure 1101 may be arranged over the first wafer 1002. In some embodiments, the active layer structure 1101 is formed on the first wafer 1002 before the first wafer 1002 is bonded to the third wafer 1106, whereas in other embodiments, the active layer structure 1101 may be formed on the first wafer 1002 after the first wafer 1002 is bonded to the third wafer 1106. In some embodiments, the active layer structure 1101 may comprise a first active layer 1102 and a second active layer 1104, wherein the first active layer 1102 is arranged between the second active layer 1104 and the first wafer 1002. In some embodiments, examples of the first and/or second active layers 1102, 1104 include anti-reflection layers, color filters, lenses, interconnect structures, or the like. It will be appreciated that other examples of the first and/or second active layers 1102, 1104 are also within the scope of the disclosure.

Figure 12A:
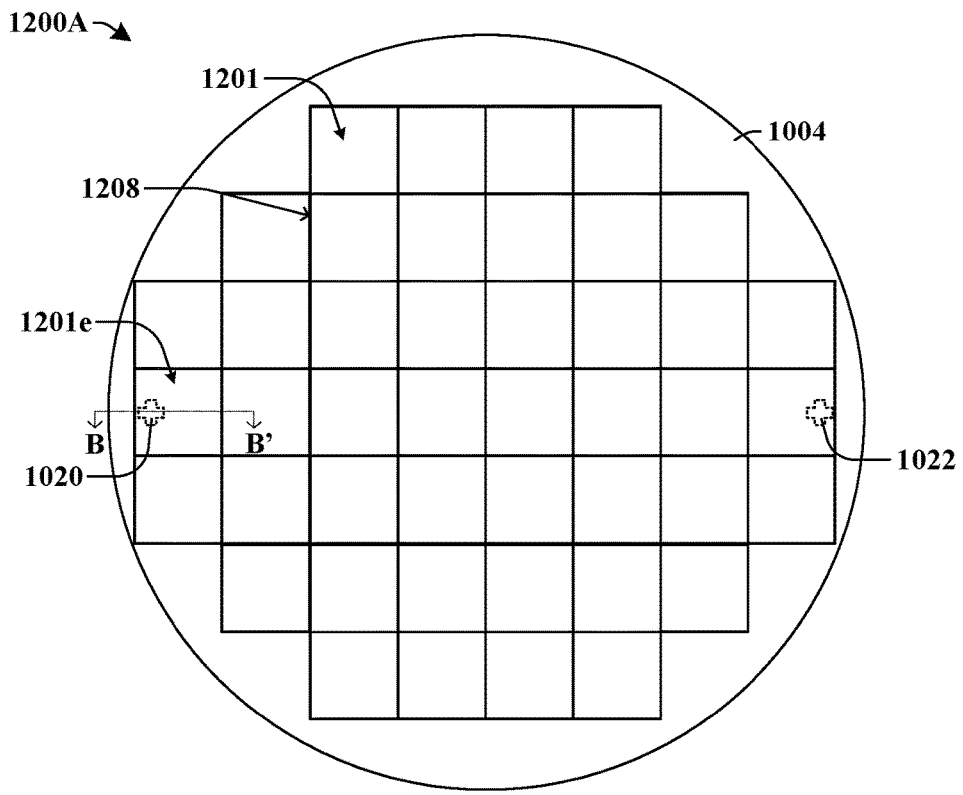
FIG. 12A illustrates a top-view of some embodiments of integrated chips on a transparent wafer, wherein an edge integrated chip of the transparent wafer comprises a first alignment mark that is transparent.

FIG. 12A illustrates a top-view 1200A of some embodiments of integrated chips on a second wafer, wherein the second wafer comprises a third transparent alignment mark and a fourth alignment mark.

In some embodiments, multiple integrated chips 1201 are formed on the second wafer 1004. In some embodiments, after the multiple integrated chips 1201 are formed over the second wafer 1004, the second wafer 1004 may go through a dicing process, wherein the second wafer 1004 is cut along boundaries 1208 of the multiple integrated chips 1201. In some embodiments, the second wafer 1004 comprises the second transparent material, and comprises the third alignment mark 1020. In some embodiments, an edge integrated chip 1201e of the multiple integrated chips 1201 will comprise the third alignment mark 1020 after dicing along the boundaries 1208. In other embodiments, the third alignment mark 1020 will be arranged outside of the boundaries 1208 of the multiple integrated chips 1201, and thus, in some other embodiments, the third alignment mark 1020 may not be present in the edge integrated chip 1201e. Further, in some embodiments, the second wafer 1004 may also comprise a fourth alignment mark 1022.

Figure 12B:
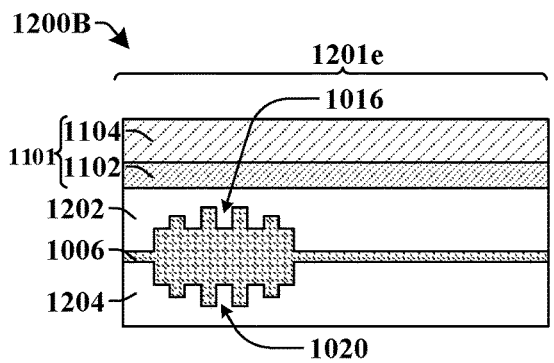
FIGS. 12B-D illustrate cross-sectional views of various embodiments of the edge integrated chip of FIG. 12A.
Figure 12C:
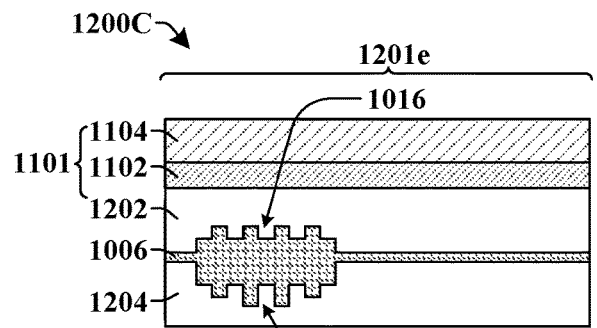
Figure 12D:
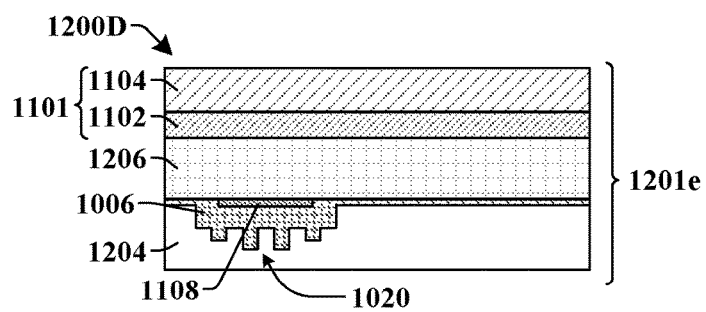

FIGS. 12B, 12C, and 12D illustrates cross-sectional views 1200B, 1200C, and 1200D, respectively, of some embodiments of the edge integrated chip 1201e comprising the third alignment mark 1020. In some embodiments, the cross-sectional views 1200B, 1200C, and 1200D may correspond to cross-section line BB' of FIG. 12A.

As illustrated in the cross-sectional view 1200B of FIG. 12B, in some embodiments, the edge integrated chip 1201e comprises the third alignment mark 1020 of a second substrate 1204 directly underlying and aligned with the first alignment mark 1016 of a first substrate 1202. In such embodiments, the first substrate 1202 may correspond to a region of the first wafer (1002 of FIG. 10), and the second substrate 1204 may correspond to a region of the second wafer (1004 of FIG. 10). In some embodiments, the first alignment mark 1016 and the third alignment mark 1020 have a substantially same design (e.g., dimensions, material, cross-sectional view, etc.). In some embodiments, the active layer structure 1101 is arranged over the first substrate 1202. In such embodiments, the active layer structure 1101 may be formed over the first substrate 1202 prior to the dicing process to form the edge integrated chip 1201e.

As illustrated in the cross-sectional view 1200C of FIG. 12C, in some embodiments, the edge integrated chip 1201e comprises the third alignment mark 1020 of the second substrate 1204 aligned with the first alignment mark 1016 of the first substrate 1202. In some embodiments, the first alignment mark 1016 may have a different design (e.g., dimensions, material, cross-sectional view, etc.) than the third alignment mark 1020. Nevertheless, the first and third alignment marks 1016, 1020 may be substantially aligned with one another.

As illustrated in the cross-sectional view 1200D of FIG. 12D, in some embodiments, the edge integrated chip 1201e comprises the third alignment mark 1020 of the second substrate 1204 aligned with a first metal alignment mark 1108 on a third substrate 1206. In some embodiments, the third substrate 1206 corresponds to a region of the third wafer (1106 of FIG. 11). Thus, in some embodiments, the second substrate 1204 and the third alignment mark 1020 are transparent, whereas the third substrate 1206 is not transparent, and the first metal alignment mark 1108 is a metal. Further, in some embodiments, the active layer structure 1101 is arranged on the third substrate 1206, and the second substrate 1204 is arranged below the active layer structure 1101. In other embodiments, the active layer structure 1101 may be omitted, or in yet other embodiments, the active layer structure 1101 may be arranged on the second substrate 1204 and the third substrate 1206, for example.

FIGS. 13-18 illustrate various views 1300-1800 of some embodiments of a method of aligning a first wafer comprising a first alignment mark to a second wafer comprising a third alignment mark. Although FIGS. 13-18 are described in relation to a method, it will be appreciated that the structures disclosed in FIGS. 13-18 are not limited to such a method, but instead may stand alone as structures independent of the method.

Figure 13:
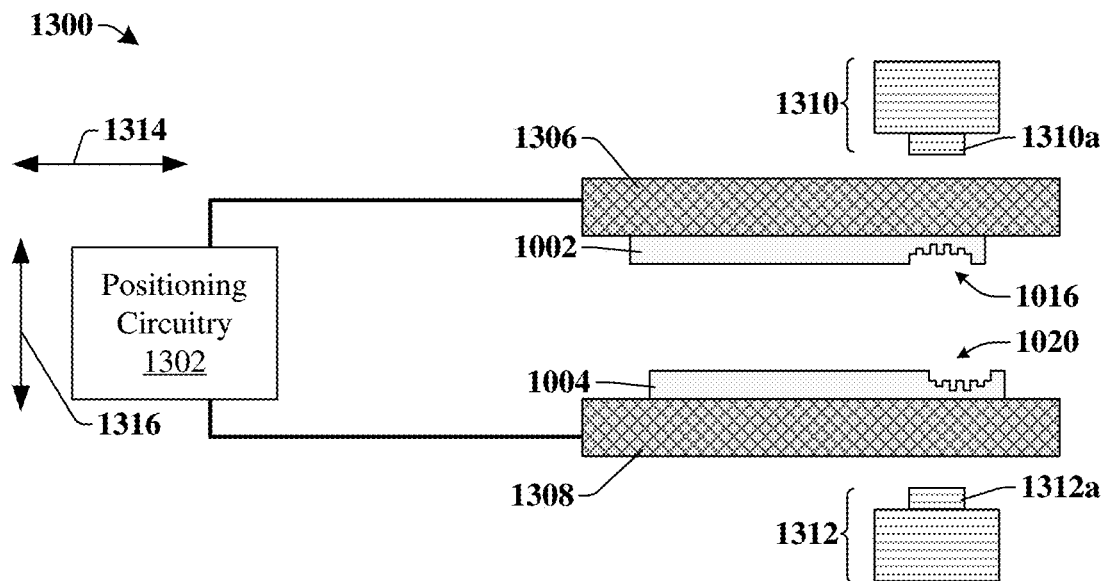
FIGS. 13-18 illustrate cross-sectional views of some embodiments of a method of aligning a first wafer that is transparent to a second wafer that is transparent according to a first alignment mark that is transparent on the first wafer and a second alignment mark that is transparent on the second wafer.

As shown in cross-sectional view 1300 of FIG. 13, an alignment apparatus may include a first wafer chuck 1306, a second wafer chuck 1308, positioning circuitry 1302, a first camera 1310, and a second camera 1312. In some embodiments, the first and second cameras 1310, 1312 may recognize features greater than about 100 nanometers. In some embodiments, the first camera 1310 may be arranged above the first and second wafer chucks 1306, 1308, and the second camera 1312 may be arranged below the first and second wafer chucks 1306, 1308. In some other embodiments, the alignment apparatus may comprise more cameras than the first camera 1310 and the second camera 1312. In some embodiments, the first and second cameras 1310, 1312 may be coupled to image processing circuitry. In some embodiments, the first camera 1310 comprises a first lens portion 1310a that is configured to apply light to and capture an image of an object on the first wafer chuck 1306, and the second camera 1312 comprises a second lens portion 1312a that is configured to apply light to and capture an image of an object on the second wafer chuck 1308. In some embodiments, the first wafer chuck 1306 is configured to hold a first wafer 1002, and the second wafer chuck 1308 is configured to hold a second wafer 1004. Further, in some embodiments, positioning circuitry 1302 is coupled to the first and second wafer chucks 1306, 1308 and configured to move the first wafer chuck 1306 and/or the second wafer chuck 1308 at least in a first direction 1314 and a second direction 1316. In some embodiments, the first direction 1314 is substantially perpendicular to the second direction 1316.

In some embodiments, the first wafer 1002 is arranged on the first wafer chuck 1306 and comprises a first alignment mark 1016, and the second wafer 1004 is arranged on the second wafer chuck 1308 and comprises a third alignment mark 1020. In some embodiments, the first wafer 1002 and the first alignment mark 1016 comprise a first transparent material, and the first wafer chuck 1306 comprises a reflective material. In some embodiments, the second wafer 1004 and the third alignment mark 1020 may comprise a second transparent material, and the second wafer chuck 1308 may comprise a reflective material. For example, in some embodiments, the first and/or second wafer chucks 1306, 1308 may comprise stainless steel, aluminum, or some other suitable reflective material. In some embodiments, the first alignment mark 1016 is arranged over the third alignment mark 1020; however, the first alignment mark 1016 may not be aligned with the third alignment mark 1020 yet.

FIGS. 14A-16 will illustrate some embodiments of aligning the first alignment mark 1016 to the third alignment mark 1020 to align the first wafer 1002 to the second wafer 1004. Further, FIGS. 17 and 18 will illustrate some embodiments of bonding the first wafer 1002 to the second wafer 1004 after the alignment of the first alignment mark 1016 to the third alignment mark 1020.

Figure 14A:
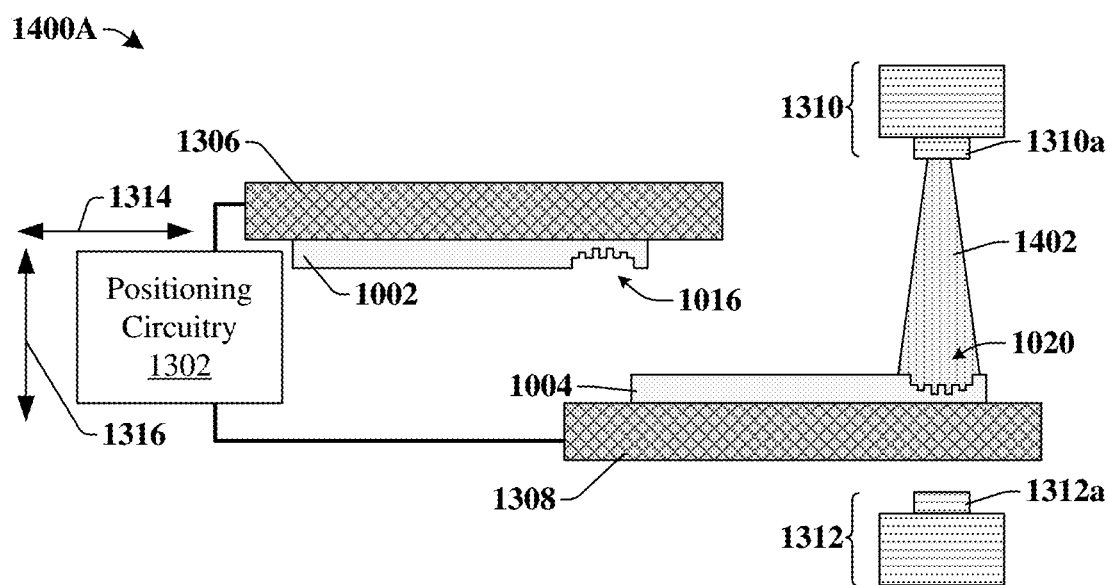

As illustrated in the cross-sectional view 1400A of FIG. 14A, in some embodiments, the positioning circuitry 1302 may be configured to move the first wafer chuck 1306 in the first direction 1314 such that the first wafer chuck 1306 is not directly between the first camera 1310 and the second wafer chuck 1308. In some embodiments, the first wafer chuck 1306 may directly overlie part of the second wafer chuck 1308, whereas in some other embodiments, the first wafer chuck 1306 may not directly overlie any of the second wafer chuck 1308 in FIG. 14A. In some other embodiments, the first and second wafer chucks 1306, 1308 may both be moved along the first direction 1314 by the positioning circuitry 1302 such that the first wafer chuck 1306 is not arranged directly between the first camera 1310 and the second wafer chuck 1308.

In some embodiments, the first camera 1310 may then apply a first light 1402 to the second wafer 1004 on the second wafer chuck 1308, and the first camera 1310 may capture at least a first image of the second wafer 1004 while the first light 1402 is applied. The first light 1402 may have a first wavelength. In some embodiments, the first wavelength may be in a range of between, for example, approximately 0.5 micrometers and approximately 0.7 micrometers. For example, in some embodiments, the first light 1402 may be red light and have a wavelength equal to about 0.6 micrometers. It will be appreciated that other wavelengths and thus, colors of the first light 1402 are also within the scope of the disclosure. In some embodiments, the first light 1402 is applied at least over the third alignment mark 1020. In some embodiments, the second camera 1312 remains off while the first camera 1310 takes the first image of the second wafer 1004.

Figure 14B:
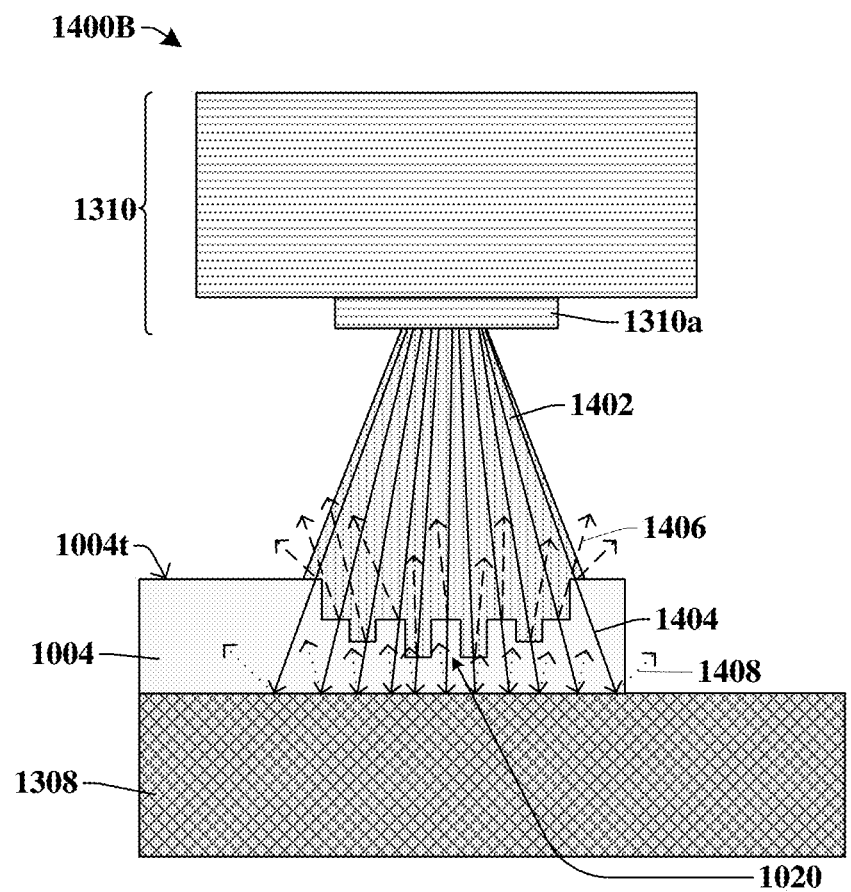

FIG. 14B illustrates a schematic 1400B of some embodiments of how the first light 1402 interacts with the third alignment mark 1020 of the second wafer 1004 and the second wafer chuck 1308.

As shown in the schematic 1400B of FIG. 14B, in some embodiments, the first light 1402 may be directed towards the third alignment mark 1020. The schematic 1400B of FIG. 14B includes exemplary applied light rays 1404 directed from the first camera 1310 and towards the second wafer 1004. In some embodiments, the applied light rays 1404 of the first light 1402 may reflect from upper surfaces of the second wafer 1004 as first reflected rays 1406 and/or travel through the second wafer 1004 and reflect from the second wafer chuck 1308 as second reflected rays 1408. In some embodiments, the first light 1402 may be applied from the first lens portion 1310a of the first camera 1310, whereas in other embodiments, the first light 1402 may be applied from a light source that is independent of the first camera 1310 or that is arranged on a different portion of the first camera 1310 than the first lens portion 1310a.

In some embodiments, the first reflected rays 1406 that reflect from the third alignment mark 1020 and/or the second reflected rays 1408 that travel through the third alignment mark 1020 and reflect from the second wafer chuck 1308 destructively interfere, whereas the first reflected rays 1406 that reflect from a topmost surface 1004t of the second wafer 1004 and/or the second reflected rays 1408 that travel through the topmost surface 1004t of the second wafer 1004 constructively interfere. The design of the third alignment mark 1020 may be adjusted to optimize the destructive interference between the first and/or second reflected rays 1406, 1408 as described in FIGS. 1-5. For example, the first alignment mark (104 of FIG. 2) in FIG. 2 has the second width ($w_2$ of FIG. 2), the third width ($w_3$ of FIG. 2), and/or third distance ($d_3$ of FIG. 2) that is about equal to the wavelength of the first light 1402 to optimize the destructive interference when the first light 1402 is applied to the first alignment mark (104 of FIG. 2). In other embodiments, the second width ($w_2$ of FIG. 2), the third width ($w_3$ of FIG. 2), and/or third distance ($d_3$ of FIG. 2) may be an integer multiple of the wavelength of the first light 1402. Further, for example, the first alignment mark (104 of FIG. 5) in FIG. 5 has a "stair-step-like" profile, and the difference in height between each "stair-step" is equal to about the sixth distance ($d_6$ of FIG. 5). In such embodiments, the sixth distance ($d_6$ of FIG. 5) may be about equal to the wavelength of the first light 1402 to optimize the destructive interference when the first light 1402 is applied to the first alignment mark (104 of FIG. 5).

Figure 14C:
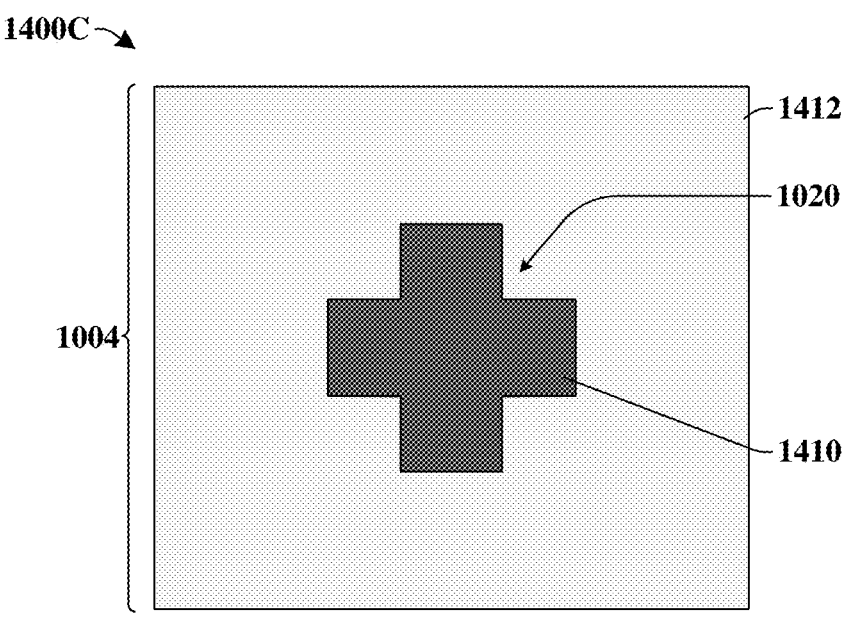

FIG. 14C illustrates an exemplary image 1400C of some embodiments of the first image captured by the first camera (1310 of FIG. 14B).

As shown in the exemplary image 1400C of FIG. 14C, in some embodiments, the first image captured by the first camera (1310 of FIG. 14B) includes the third alignment mark 1020 indicated by a dark region 1410 in the first image compared to a light region 1412 of the first image. In such embodiments, the dark region 1410 is due to destructive interference and the light region 1412 is due to constructive interference. Thus, the light region 1412 may be associated with the topmost surface (1004t of FIG. 14B) of the second wafer 1004. In some embodiments, the dark region 1410 associated with the third alignment mark 1020 may exhibit a cross-like shape, whereas in other embodiments, depending on the design of the third alignment mark 1020, the dark region 1410 associated with the third alignment mark 1020 may exhibit other shapes such as a circle, octagon, rectangle, or some other suitable shape. In some embodiments, the first image may be analyzed by image processing circuitry and the location of the third alignment mark 1020 on the second wafer 1004 and with respect to the second wafer chuck 1308 may be identified. In some embodiments, minimum dimensions of the dark region 1410 are at least equal to about 100 nanometers to be detected by the first camera (1310 of FIG. 14B). In other embodiments, the first camera (1310 of FIG. 14B) may be able to detect features smaller than 100 nanometers. In some embodiments, the image processing circuitry and/or the positioning circuitry (1302 of FIG. 14A) may store the location of the third alignment mark 1020. Thus, although the second wafer 1004 and the third alignment mark 1020 may comprise the second transparent material, the third alignment mark 1020 may be identified by the first camera (1310 of FIG. 14B).

Figure 15:
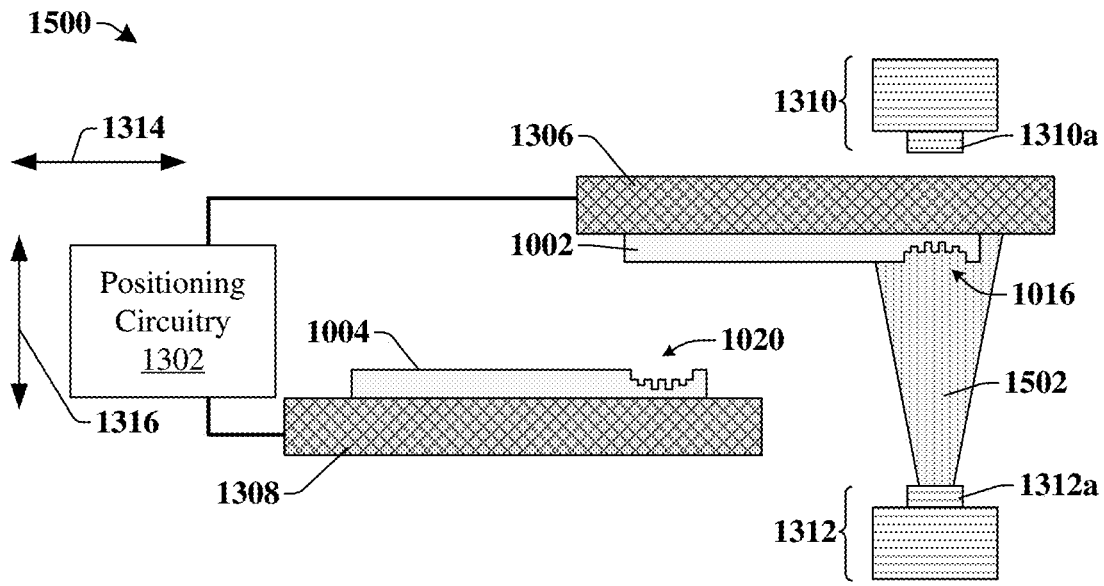

As shown in cross-sectional view 1500 of FIG. 15, in some embodiments, the positioning circuitry 1302 may be configured to move the second wafer chuck 1308 in the first direction 1314 such that the second wafer chuck 1308 is not directly between the second camera 1312 and the first wafer chuck 1306. In some embodiments, the second wafer chuck 1308 may directly overlie part of the first wafer chuck 1306, whereas in some other embodiments, the second wafer chuck 1308 may not directly overlie any of the first wafer chuck 1306. In some other embodiments, the first and second wafer chucks 1306, 1308 may both be moved along the first direction 1314 by the positioning circuitry 1302 such that the second wafer chuck 1308 is not arranged directly between the second camera 1312 and the first wafer chuck 1306.

In some embodiments, the second camera 1312 may then apply a second light 1502 to the first wafer 1002 on the first wafer chuck 1306, and the second camera 1312 may capture at least a second image of the first wafer 1002. The second light 1502 may have a second wavelength. In some embodiments, the second wavelength may be in a range of between, for example, approximately 0.5 micrometers and approximately 0.7 micrometers. For example, in some embodiments, the second light 1502 may be red light and have a wavelength equal to about 0.6 micrometers. It will be appreciated that other wavelengths and thus, colors of the second light 1502 are also within the scope of the disclosure. In some embodiments, the first wavelength of the first light (1402 of FIG. 14A) is about equal to the second wavelength of the second light 1502, whereas in other embodiments, the first wavelength of the first light (1402 of FIG. 14A) may be different from the second wavelength of the second light 1502. In some embodiments, the second light 1502 is applied at least over the first alignment mark 1016. In some embodiments, the first camera 1310 remains off while the second camera 1312 takes the second image of the first wafer 1002.

In some embodiments, due to a contrast between destructive and constructive interference of the second light 1502 on the first wafer 1002, on the first wafer chuck 1306, and on the first alignment mark 1016, the second image may be analyzed and the location of the first alignment mark 1016 with respect to the first wafer 1002 and with respect to the first wafer chuck 1306 may be determined. The location of the first alignment mark 1016 may be stored by the positioning circuitry and/or the image processing circuitry, in some embodiments. In some embodiments, the first alignment mark 1016 has a same overall shape as the third alignment mark 1020 to increase the accuracy and precision of aligning the first wafer 1002 to the second wafer 1004 based on the first alignment mark 1016 and the third alignment mark 1020.

Figure 16:
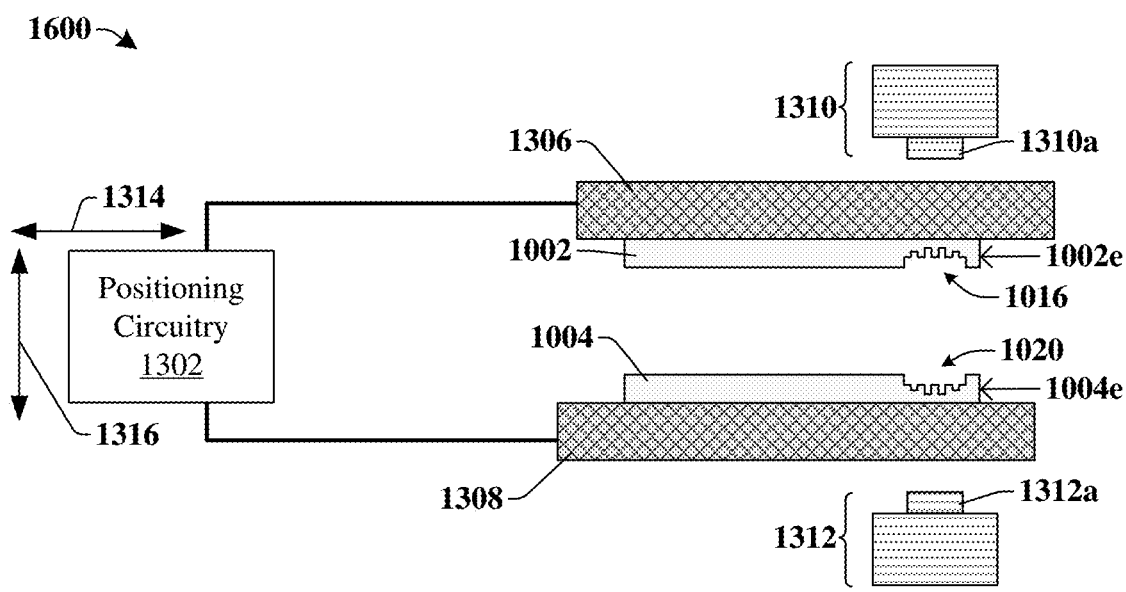

As shown in cross-sectional view 1600 of FIG. 16, in some embodiments, the positioning circuitry 1302 is configured to move the first and/or second wafer chucks 1306, 1308 in the first direction 1314 to align the first alignment mark 1016 to the third alignment mark 1020 based on the stored location of the first alignment mark 1016 on the first wafer 1002 and the stored location of the third alignment mark 1020 on the second wafer 1004. In some embodiments, after aligning the first alignment mark 1016 to the third alignment mark 1020, a first midpoint (1024 of FIG. 10) of the first alignment mark 1016 directly overlies with a third midpoint (1028 of FIG. 10) of the third alignment mark 1020. Further, in some embodiments, after aligning the first alignment mark 1016 to the third alignment mark 1020, a first edge 1002e of the first wafer 1002 directly overlies a second edge 1004e of the second wafer 1004.

Figure 17:
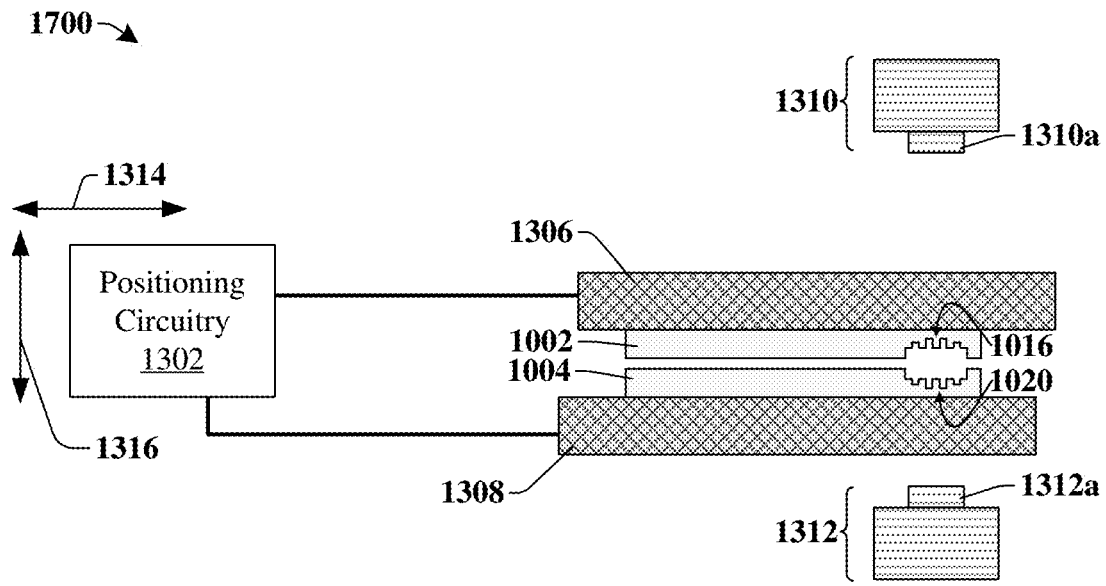

As shown in cross-sectional view 1700 of FIG. 17, in some embodiments, after aligning the first wafer 1002 to the second wafer 1004, a bonding process may be performed, wherein first, the first and second wafer chucks 1306, 1308 are moved towards one another in the second direction 1316 by the positioning circuitry 1302. To maintain alignment of the first and second wafers 1002, 1004, the positioning circuitry 1302 does not move the first or second wafer chuck 1306, 1308 in the first direction 1314.

Figure 18:
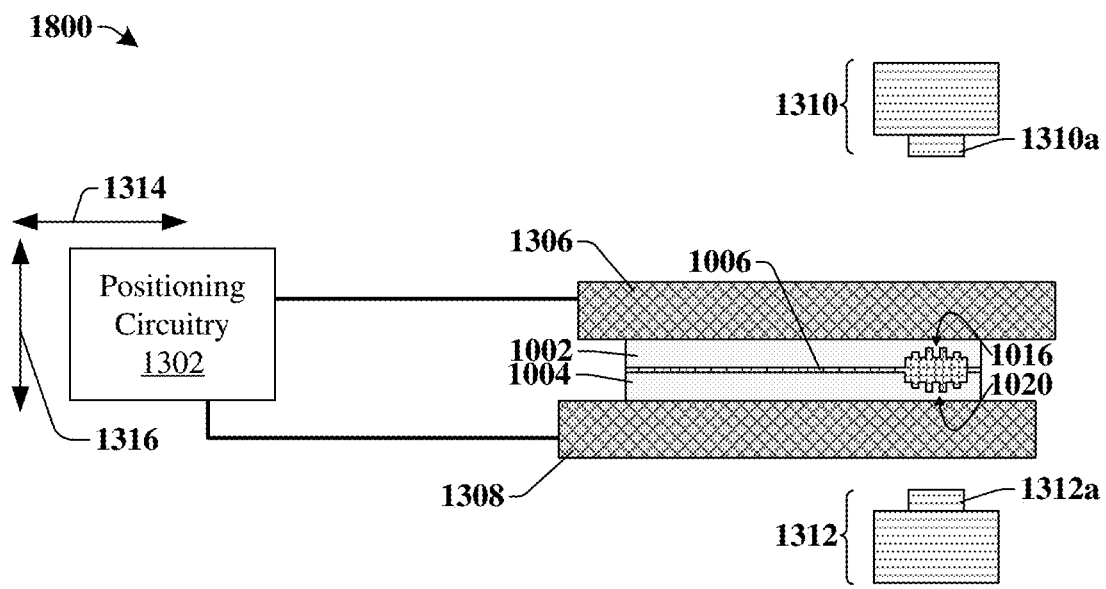

As shown in cross-sectional view 1800 of FIG. 18, in some embodiments, a bonding structure 1006 may be applied between the first wafer 1002 and the second wafer 1004 to bond the first wafer 1002 to the second wafer 1004. In some embodiments, the positioning circuitry 1302 further moves the first wafer chuck 1306 and the second wafer chuck 1308 towards one another in the second direction 1316 during or after the bonding structure 1006 is applied. In some embodiments, the bonding structure 1006 comprises, for example, a transparent epoxy or some other suitable transparent glue material. It will be appreciated that in some other embodiments, the bonding structure 1006 may be a non-transparent material.

Figure 19:
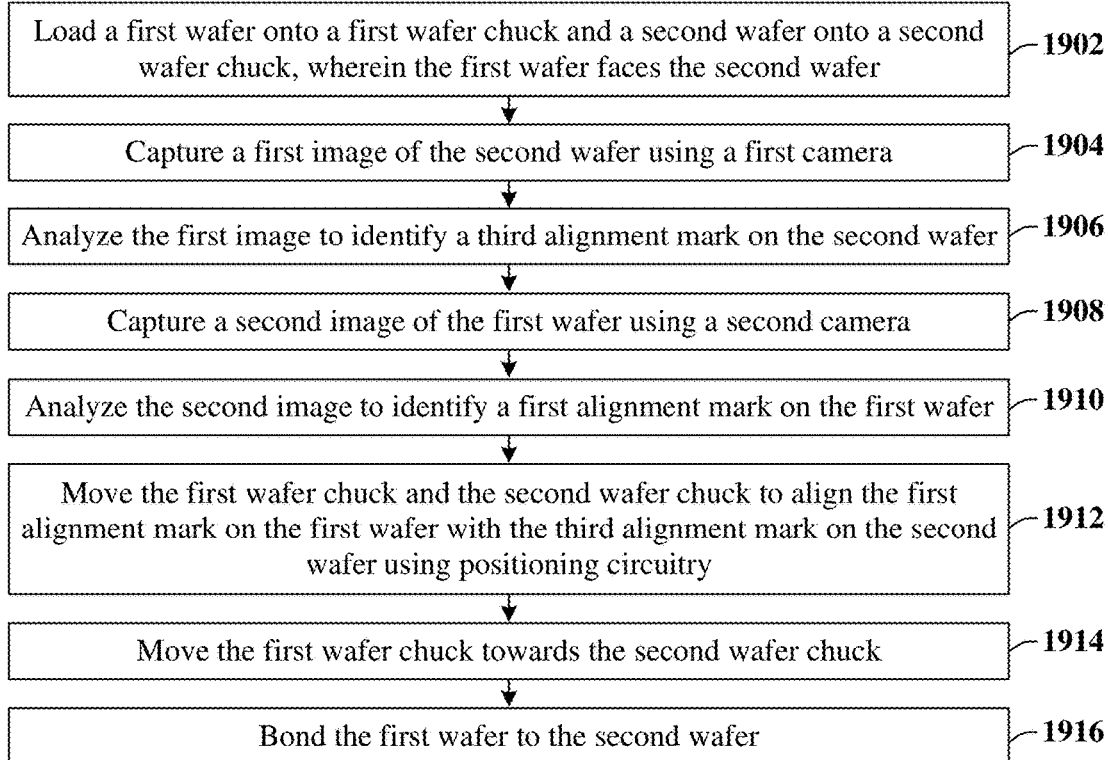
FIG. 19 illustrates a flow diagram of some embodiments corresponding to the method illustrated in FIGS. 13-18.

FIG. 19 illustrates a flow diagram of some embodiments of a method 1900 corresponding to FIGS. 13-18.

While method 1900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1902, a first wafer is loaded onto a first wafer chuck, and a second wafer is loaded onto a second wafer chuck, wherein the first wafer faces the second wafer. FIG. 13 illustrates a cross-sectional view 1300 of some embodiments corresponding to act 1902.

At act 1904, a first image of the second wafer is captured using a first camera. FIG. 14A illustrates a cross-sectional view 1400A of some embodiments corresponding to act 1904.

At act 1906, the first image is analyzed to identify a third alignment mark on the second wafer. FIG. 14C illustrates an exemplary image 1400C of some embodiments corresponding to act 1906.

At act 1908, a second image of the first wafer is captured using a second camera. FIG. 15 illustrates a cross-sectional view 1500 of some embodiments corresponding to act 1908.

At act 1910, the second image is analyzed to identify a first alignment mark on the first wafer.

At act 1912, the first wafer chuck and the second wafer chuck are moved by positioning circuitry to align the first alignment mark on the first wafer with the third alignment mark on the second wafer. FIG. 16 illustrates a cross-sectional view 1600 of some embodiments corresponding to act 1912.

At act 1914, the first wafer chuck is moved towards the second wafer chuck. FIG. 17 illustrates a cross-sectional view 1700 of some embodiments corresponding to act 1914.

At act 1916, the first wafer is bonded to the second wafer. FIG. 18 illustrates a cross-sectional view 1800 of some embodiments corresponding to act 1916.

FIGS. 20A-24B illustrate various views 2000A-2400B of some embodiments of a method of forming a transparent alignment mark on a transparent wafer. Although FIGS. 20A-24B are described in relation to a method, it will be appreciated that the structures disclosed in FIGS. 20A-24B are not limited to such a method, but instead may stand alone as structures independent of the method.

Figure 20A:
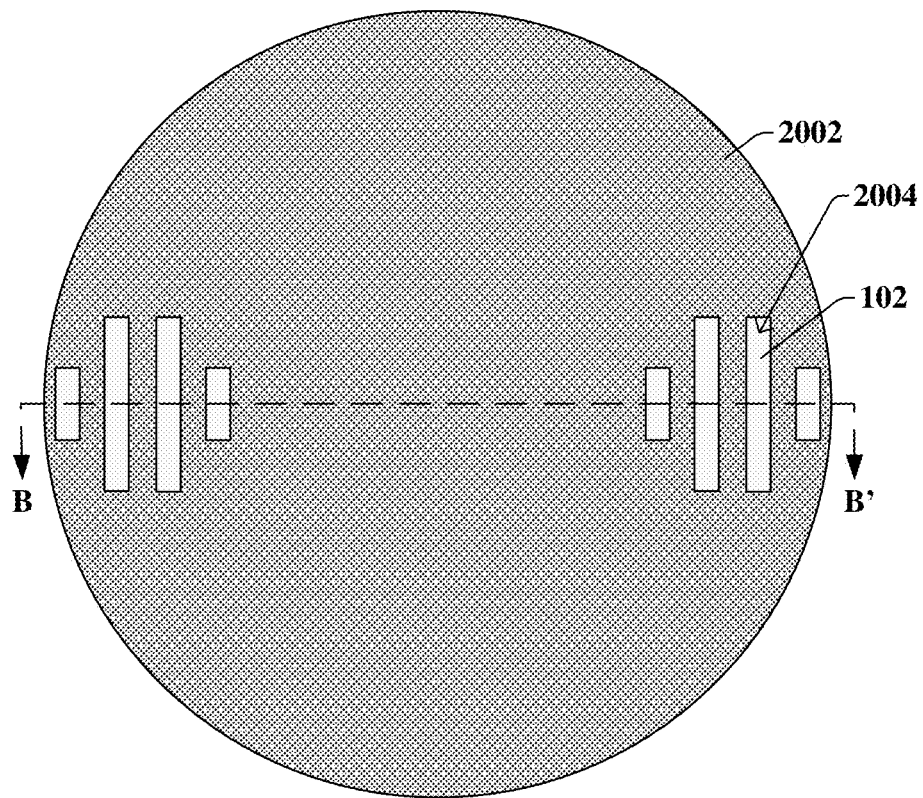
FIGS. 20A-24B illustrate various views of some embodiments of forming a first alignment mark in a first wafer, wherein the first alignment mark is transparent and is formed by removing portions of the first wafer.

As shown in top-view 2000A of FIG. 20A, in some embodiments, a first masking structure 2002 is formed over a transparent wafer 102. In some embodiments, the first masking structure 2002 comprises first openings 2004 that expose portions of the transparent wafer 102. In some embodiments, the first openings 2004 are rectangles extending in parallel and spaced apart from one another to form the first and second alignment marks (104, 106) of FIG. 1, for example. In other embodiments, the first openings 2004 may appear to be concentric ring-like structures spaced apart from one another, for example, to form the first and second alignment marks (104, 106) of FIG. 8. In some embodiments, the first masking structure 2002 may be formed using deposition (e.g., spin-on), photolithography, and removal (e.g., etching) processes. In some embodiments, the first masking structure 2002 comprises a photoresist material or a hard mask material.

Figure 20B:
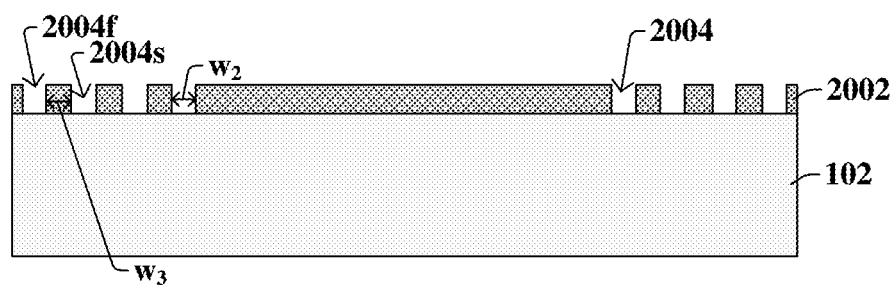

FIG. 20B illustrates a cross-sectional view 2000B of some embodiments of the first masking structure 2002 formed over the transparent wafer 102. In some embodiments, the cross-sectional view 2000B corresponds to cross-section line BB' of FIG. 20A.

As shown in the cross-sectional view 2000B of FIG. 20B, in some embodiments, the first openings 2004 of the first masking structure 2002 have a third width $w_3$. In some embodiments, a first one 2004f of the first openings 2004 may be spaced apart from a second one 2004s of the first openings 2004 by a third width $w_3$. In some embodiments, the second width $w_2$ may be about equal to the third width $w_3$.

Figure 21A:
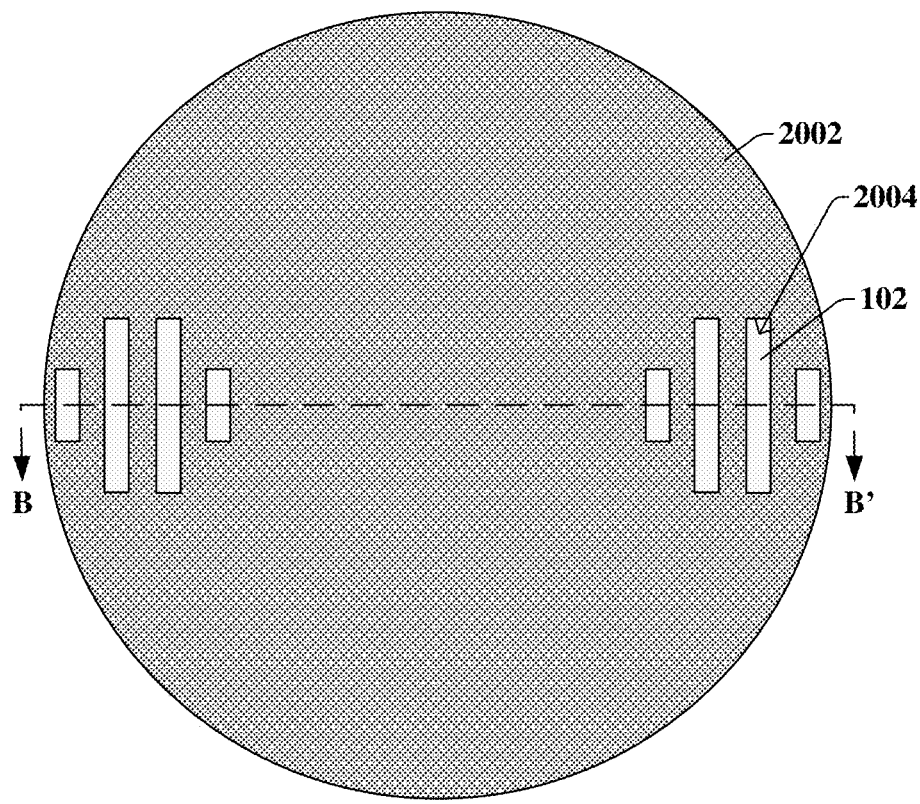

FIG. 21A illustrates a top-view 2100A of some embodiments of the transparent wafer 102 after a first removal process (see, 2102 of FIG. 21B) according to the first masking structure 2002. In some embodiments, from the top-view 2100A, the transparent wafer 102 looks substantially the same after the first removal process (see, 2102 of FIG. 21B) than before the first removal process as shown in the top-view 2100A of FIG. 21A.

Figure 21B:
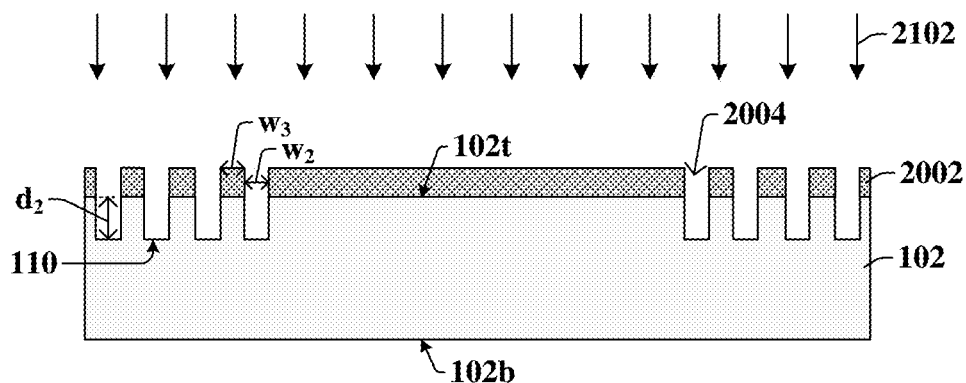

FIG. 21B illustrates a cross-sectional view 2100B of some embodiments of the first removal process 2102 according to the first masking structure 2002. In some embodiments, the cross-sectional view 2100B corresponds to cross-section line BB' of FIG. 21A.

As shown in the cross-sectional view 2100B of FIG. 21B, in some embodiments, the first removal process 2102 removes portions of the transparent wafer 102 that directly underlie the first openings 2004 of the first masking structure 2002. In some embodiments, the first removal process 2102 defines second surfaces 110 of the transparent wafer 102 arranged between a topmost surface 102t of the transparent wafer 102 and a bottommost surface 102b of the transparent wafer 102. In some embodiments, the first removal process 2102 is conducted for a first time period such that the second surfaces 110 are arranged at a second depth $d_2$ from the topmost surface 102t of the transparent wafer 102. In some embodiments, the first removal process may be a dry etching process that comprises a first dry etchant.

Figure 22A:
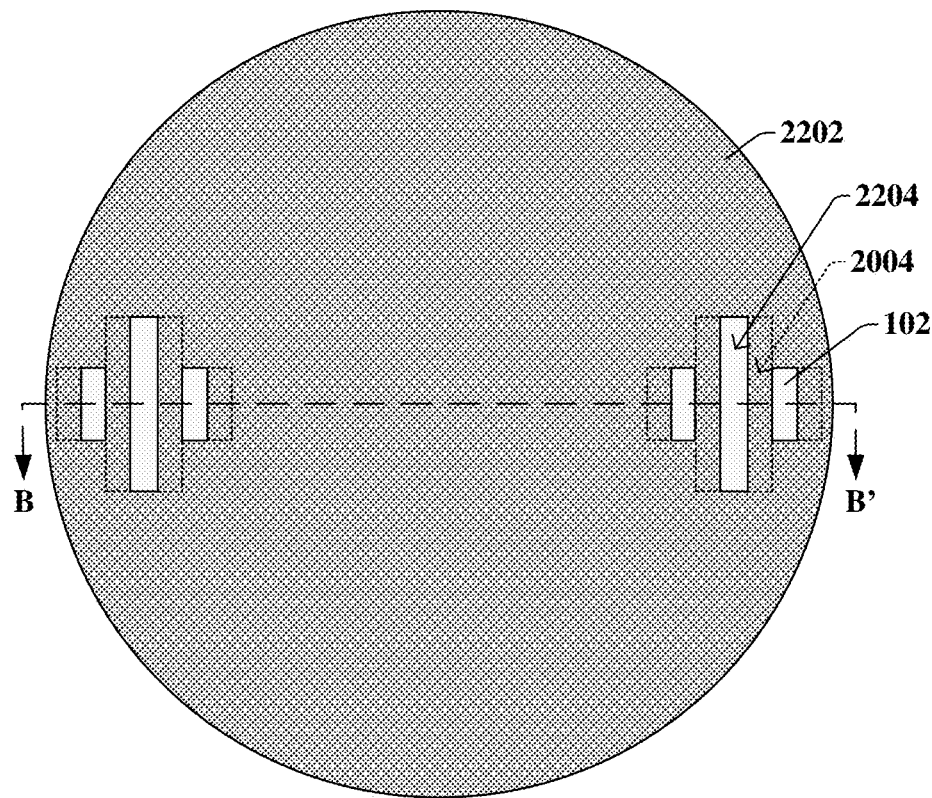

As shown in top-view 2200A of FIG. 22A, in some embodiments, the first masking structure (2002 of FIG. 21A) is removed, and a second masking structure 2202 is formed over the transparent wafer 102. In some embodiments, the second masking structure 2202 comprises second openings 2204 that expose the transparent wafer 102. In some embodiments, the second openings 2204 are arranged between the first openings 2004 of the first masking structure (2002 of FIG. 21A). In some embodiments, the second openings 2204 are rectangles extending in parallel and spaced apart from one another, for example. It will be appreciated that the first openings 2004 of the first masking structure (2002 of FIG. 21A) are not actually present in the top-view 2200A of FIG. 22A, and thus, the first openings 2004 are illustrated with dotted lines. In some embodiments, the second masking structure 2202 may be formed using deposition (e.g., spin-on), photolithography, and removal (e.g., etching) processes. In some embodiments, the second masking structure 2202 comprises a photoresist material or a hard mask material.

Figure 22B:
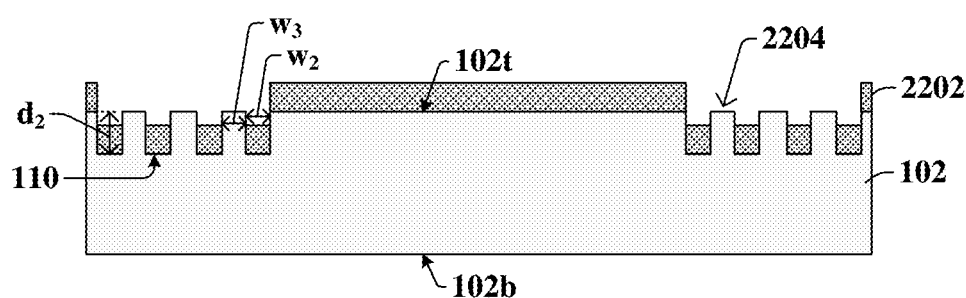

FIG. 22B illustrates a cross-sectional view 2200B of some embodiments of the second masking structure 2202 formed over the transparent wafer 102. In some embodiments, the cross-sectional view 2200B corresponds to cross-section line BB' of FIG. 22B.

As shown in the cross-sectional view 2200B of FIG. 22B, in some embodiments, the second openings 2204 of the second masking structure 2202 have the third width $w_3$. Further, in some embodiments, the second masking structure 2202 covers the second surfaces 110 of the transparent wafer 102. In some embodiments, portions of the second masking structure 2202 may be arranged below the topmost surface 102t of the transparent wafer.

Figure 23A:
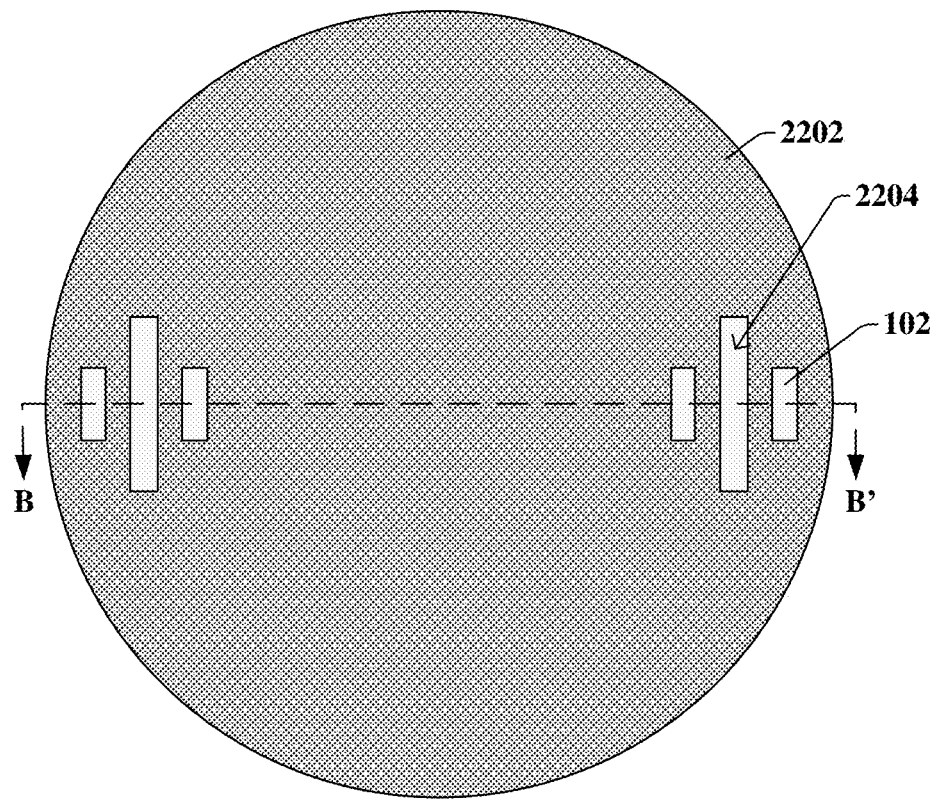

FIG. 23A illustrates a top-view 2300A of some embodiments of the transparent wafer 102 after a second removal process (see, 2302 of FIG. 23B) according to the second masking structure 2202. In some embodiments, from the top-view 2300A, the first wafer looks substantially the same after the second removal process (see, 2302 of FIG. 23B) than before the second removal process in the top-view 2200A of FIG. 22A.

Figure 23B:
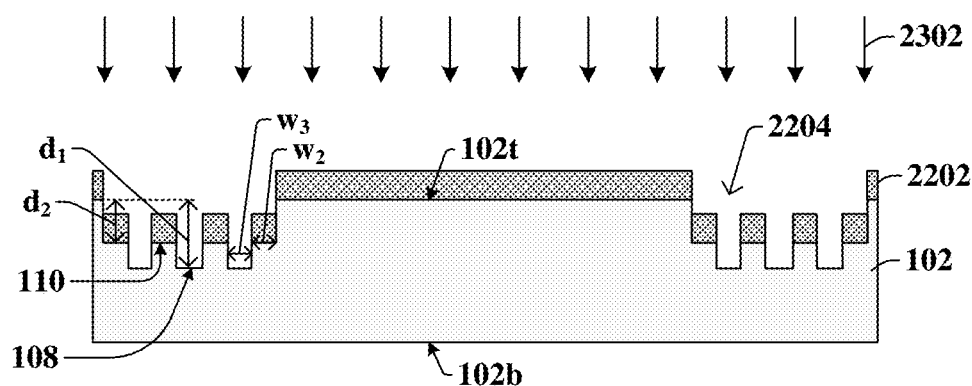

FIG. 23B illustrates a cross-sectional view 2300B of some embodiments of the second removal process 2302 according to the second masking structure 2202. In some embodiments, the cross-sectional view 2300B corresponds to cross-section line BB' of FIG. 23A.

As shown in the cross-sectional view 2300B of FIG. 23B, in some embodiments, the second removal process 2302 removes portions of the transparent wafer 102 that directly underlie the second openings 2204 of the second masking structure 2202. In some embodiments, the second removal process 2302 defines first surfaces 108 of the transparent wafer 102 arranged between the topmost surface 102t of the transparent wafer 102 and the bottommost surface 102b of the transparent wafer 102. Further, in some embodiments, the first surfaces 108 are arranged between the second surfaces 110 and the bottommost surface 102b of the transparent wafer 102. In some embodiments, the second removal process 2302 is conducted for a second time period such that the first surfaces 108 are arranged at a first depth $d_1$ from the topmost surface 102t of the transparent wafer 102. In some embodiments, the second removal process may be a dry etching process that comprises a second dry etchant. In some embodiments, second dry etchant may be the same as the first dry etchant, and thus, to make the first depth $d_1$ greater than the second depth $d_2$, the second time period may be greater than the first time period.

As shown in top-view 2400A, in some embodiments, the second masking structure (2202 of FIG. 23A) may be removed, and the transparent wafer 102 may comprise a first alignment mark 104 and a second alignment mark 106 arranged on the transparent substrate. It will be appreciated that in because the first and second alignment marks 104, 106 comprise the same material as the transparent wafer 102, the first and second alignment marks 104, 106 are illustrated with dotted lines.

Figure 24A:
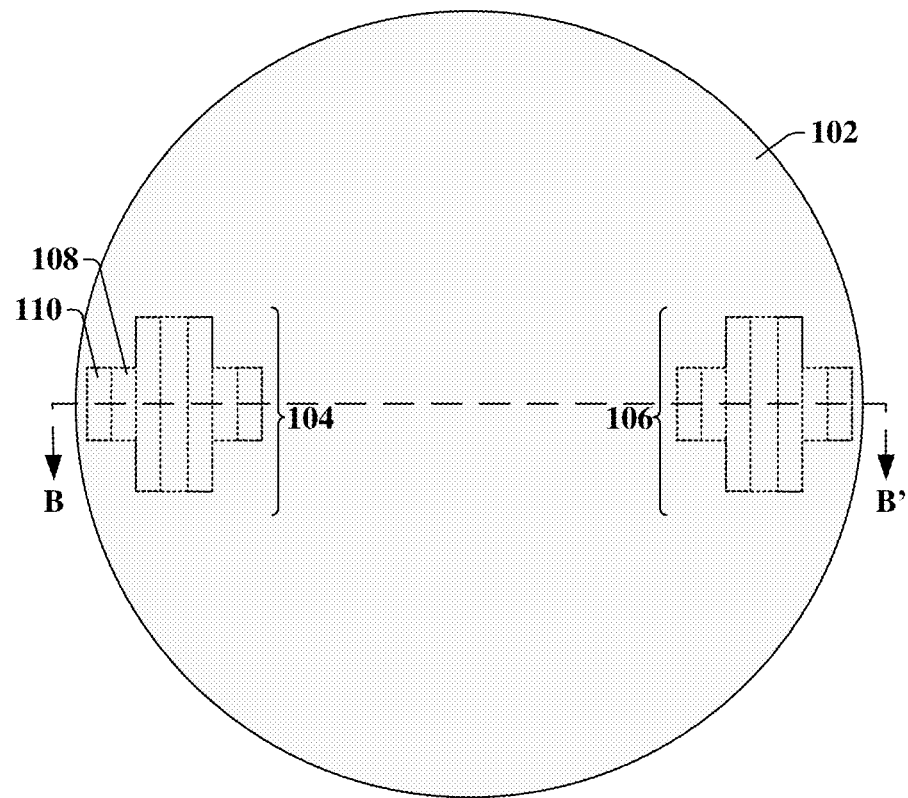
Figure 24B:
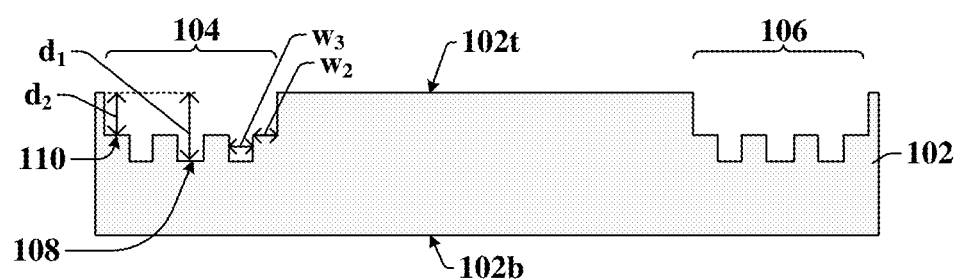

FIG. 24B illustrates a cross-sectional view 2400B of some embodiments of the first alignment mark 104 and the second alignment mark 106 arranged on the transparent wafer 102.

It will be appreciated that the method illustrated in FIGS. 20A-24B may be modified to form the first and/or second alignment marks 104, 106 to take on other designs, such as those designs described in FIGS. 2-9 of the present disclosure. Further, it will be appreciated that the method illustrated in FIGS. 20A-24B may be modified to accommodate more or less than the first and second alignment marks 104, 106 on the transparent wafer 102. Nevertheless, the method illustrated in FIGS. 20A-24B may provide a low-cost alternative to forming an alignment mark that is also transparent that may be accurately and precisely located on the transparent wafer.

Figure 25:
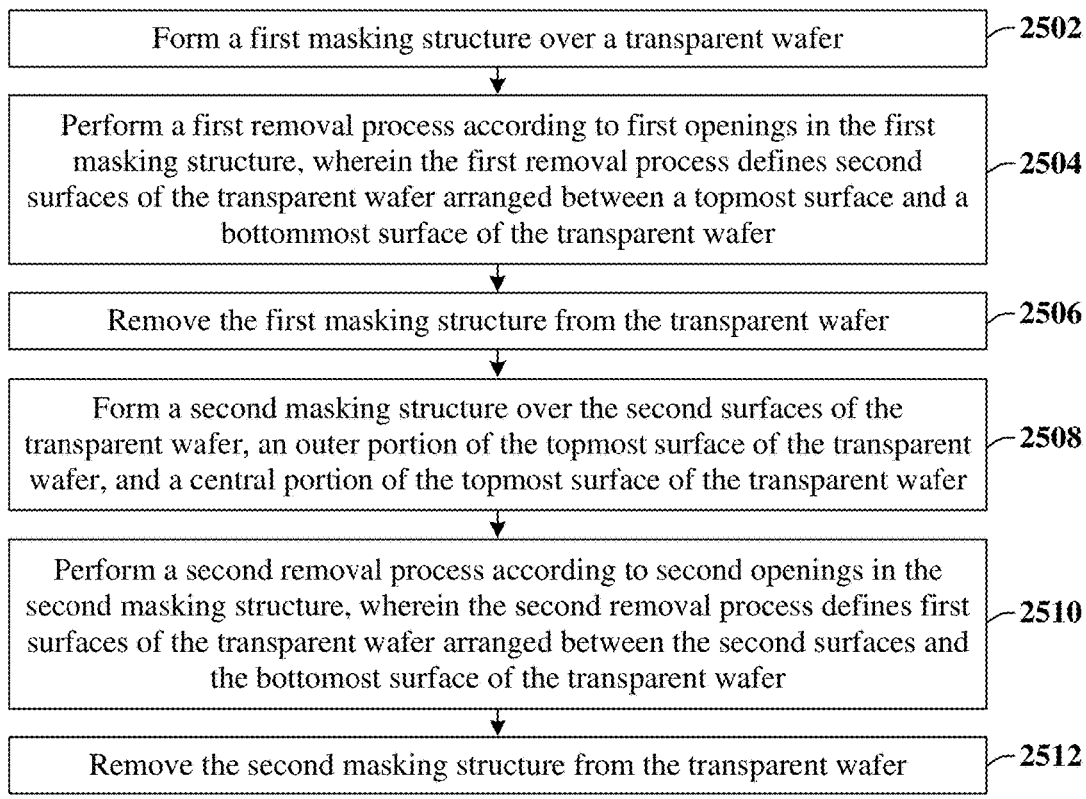
FIG. 25 is a flow diagram of some embodiments corresponding to the method illustrated in FIGS. 20A-24B.

FIG. 25 illustrates a flow diagram of some embodiments of a method 2500 corresponding to FIGS. 20A-24B.

While method 2500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2502, a first masking structure may be formed over a first transparent wafer. FIG. 20B illustrates a cross-sectional view 2000B of some embodiments corresponding to act 2502.

At act 2504, a first removal process may be performed according to first openings in the first masking structure. The first removal process defines second surfaces of the transparent wafer arranged between a topmost surface and a bottommost surface of the transparent wafer. FIG. 21B illustrates a cross-sectional view 2100B of some embodiments corresponding to act 2504.

At act 2506, the first masking structure is removed from the transparent wafer.

At act 2508, a second masking structure is formed over the second surfaces of the transparent wafer, an outer portion of the topmost surface of the transparent wafer, and a central portion of the topmost surface of the transparent wafer. FIG. 22B illustrates a cross-sectional view 2200B of some embodiments corresponding to acts 2506 and 2508.

At act 2510, a second removal process is performed according to second openings in the second masking structure. The second removal process defines first surfaces of the transparent wafer arranged between the second surfaces and the bottommost surface of the transparent wafer. FIG. 23B illustrates a cross-sectional view 2300B of some embodiments corresponding to act 2510.

At act 2512, the second masking structure is removed from the transparent wafer. FIG. 24B illustrates a cross-sectional view 2400B of some embodiments corresponding to act 2512.

Therefore, the present disclosure relates to a method of forming a transparent alignment mark in a transparent substrate, and aligning the transparent alignment mark to another alignment mark to reliably bond the transparent substrate to another substrate using the transparent alignment mark and the another alignment mark.

Accordingly, in some embodiments, the present disclosure relates to an integrated chip comprising: a first substrate comprising: a first transparent material, and a first alignment mark on an outer region of the first substrate and comprising the first transparent material, wherein the first alignment mark is defined by surfaces of the first substrate that are arranged between an uppermost surface of the first substrate and a lowermost surface of the first substrate; a second substrate comprising: a second alignment mark on an outer region of the second substrate, wherein the second alignment mark directly underlies the first alignment mark; and a bonding structure arranged directly between the uppermost surface of the first substrate and an uppermost surface of the second substrate and arranged directly between the first alignment mark and the second alignment mark.

In other embodiments, the present disclosure relates to a method for bonding a first wafer to a second wafer comprising: loading a first wafer onto a first wafer chuck and a second wafer onto a second wafer chuck, wherein the first wafer faces the second wafer, wherein the first wafer comprises a first transparent material, and wherein the first wafer comprises a first alignment mark comprising the first transparent material; applying a first light to the first wafer; capturing a first image of the first wafer using a first camera while the first light is being applied to the first wafer; analyzing the first image to identify the first alignment mark on the first wafer; applying a second light to the second wafer; capturing a second image of the second wafer using a second camera while the second light is being applied to the second wafer; analyzing the second image to identify a second alignment mark on the second wafer; moving the first wafer chuck and the second wafer chuck using positioning circuitry to align the first alignment mark on the first wafer with the second alignment mark on the second wafer; and bonding the first wafer to the second wafer.

In yet other embodiments, the present disclosure relates to a method for forming an alignment mark on a transparent wafer comprising: forming a first masking structure on a topmost surface of a transparent wafer, wherein the first masking structure comprises first openings arranged directly over an outer region of the topmost surface of the transparent wafer; performing a first removal process according to the first openings in the first masking structure to define first surfaces of the alignment mark arranged at a first distance from the topmost surface of the transparent wafer; removing the first masking structure; forming a second masking structure over the first surfaces of the alignment mark, wherein the second masking structure comprises second openings arranged over portions of the topmost surface of the transparent wafer that are between the first surfaces of the alignment mark; performing a second removal process according to the second openings of the second masking structure to define second surfaces of the alignment mark at a second distance from the topmost surface of the transparent wafer; and removing the second masking structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for bonding a first wafer to a second wafer comprising:
    loading a first wafer onto a first wafer chuck and a second wafer onto a second wafer chuck, wherein the first wafer faces the second wafer, wherein the first wafer comprises a first transparent material, and wherein the first wafer comprises a first alignment mark comprising the first transparent material;
    applying a first light to the first wafer;
    capturing a first image of the first wafer using a first camera while the first light is being applied to the first wafer;
    analyzing the first image to identify the first alignment mark on the first wafer;
    applying a second light to the second wafer;
    capturing a second image of the second wafer using a second camera while the second light is being applied to the second wafer;
    analyzing the second image to identify a second alignment mark on the second wafer;
    moving the first wafer chuck and the second wafer chuck using positioning circuitry to align the first alignment mark on the first wafer with the second alignment mark on the second wafer; and
    bonding the first wafer to the second wafer;

wherein the first alignment mark has a plurality of first surfaces and a plurality of second surfaces that are entirely recessed relative to a topmost surface of the first wafer and that face a same direction as the topmost surface, and wherein each of the second surfaces is coupled to a neighboring one of the first surfaces by a sidewall extending from that second surface to the neighboring one of the first surfaces.

2. The method of claim 1, wherein the first wafer chuck comprises a reflective material.

3. The method of claim 1, wherein the second wafer and the second alignment mark comprise a second transparent material.

4. The method of claim 1, wherein the first alignment mark comprises:
a first protrusion protruding from a lower surface of the first alignment mark and towards the topmost surface of the first wafer to a first distance measured from the lower surface of the first alignment mark to a topmost surface of the first protrusion, wherein the lower surface of the first alignment mark is arranged between the topmost surface of the first wafer and a bottommost surface of the first wafer; and
a second protrusion protruding from the lower surface of the first alignment mark and towards the topmost surface of the first wafer to a second distance measured from the lower surface of the first alignment mark to a topmost surface of the second protrusion, wherein the second protrusion is spaced apart from the first protrusion by a third distance;
wherein the lower surface is one of the second surfaces, and wherein the topmost surface of the first protrusion is one of the first surfaces and the topmost surface of the second protrusion is another one of the first surfaces.

5. The method of claim 4, wherein the first, second, and third distances are about equal to one another.

6. The method of claim 1, wherein light rays reflect from the first and second surfaces, the topmost surface of the first wafer, and the first wafer chuck during the applying of the first light, and wherein reflections of the light rays destructively interfere at the first alignment mark and constructively interfere outside the first alignment mark.

7. The method of claim 1, wherein the first alignment mark has a plurality third surfaces that are entirely recessed relative to the topmost surface of the first wafer, that face the same direction as the topmost surface, and that are recessed relative to the first and second surfaces, and wherein each of the third surfaces is coupled to a neighboring one of the first surfaces by a sidewall extending from that third surface to the neighboring one of the first surfaces.

8. The method of claim 1, wherein the first surfaces alternate periodically with the second surfaces from a first side of the first alignment mark to a second side of the first alignment mark opposite the first side.

9. The method of claim 1, wherein the first and second surfaces have individual ring-shaped top geometries.

10. A method for forming an alignment mark on a transparent wafer comprising:
forming a first masking structure on a topmost surface of a transparent wafer, wherein the first masking structure comprises first openings arranged directly over an outer region of the topmost surface of the transparent wafer;
performing a first removal process according to the first openings in the first masking structure to define first surfaces of the alignment mark arranged at a first distance from the topmost surface of the transparent wafer;
removing the first masking structure completely;
after the removing of the first masking structure, forming a second masking structure over the first surfaces of the alignment mark, wherein the second masking structure comprises second openings arranged over portions of the topmost surface of the transparent wafer that are between the first surfaces of the alignment mark;
performing a second removal process according to the second openings of the second masking structure to define second surfaces of the alignment mark at a second distance from the topmost surface of the transparent wafer; and
removing the second masking structure.

11. The method of claim 10, wherein the first openings in the first masking structure extend in parallel with one another, wherein the first openings are spaced apart from one another by a third distance, and wherein the first openings have respective widths about equal to the third distance.

12. The method according to claim 10, wherein the first and second surfaces are recessed relative to the topmost surface of the transparent wafer and face a same direction as the topmost surface, and wherein each of the second surfaces is coupled to a neighboring one of the first surfaces by a sidewall extending from that second surface to the neighboring one of the first surfaces.

13. The method according to claim 10, wherein the first removal process is a first etch with the first masking structure in place, and wherein the second removal process is a second etch with the second masking structure in place.

14. A method comprising:
providing a first wafer comprising transparent material and further comprising a first alignment mark formed by the transparent material;
arranging the first wafer on a first wafer chuck, which is reflective;
arranging a second wafer on a second wafer chuck, wherein the second wafer comprises a second alignment mark;
imaging the first wafer to determine a first location of the first alignment mark;
imaging the second wafer to determine a second location of the second alignment mark;
controlling the first wafer chuck and the second wafer chuck to move the first and second alignment marks into alignment based on the determined first and second locations; and
bonding the first and second wafers together while in alignment;
wherein the first alignment mark comprises an uneven surface formed by the transparent material and entirely recessed relative to a topmost surface of the first wafer to define a bottom of a recess in the topmost surface of the first wafer.

15. The method of claim 14, wherein the second alignment mark comprises a metal.

16. The method of claim 14, wherein the uneven surface comprises a plurality of first-level surface segments and a plurality of second-level surface segments facing a same direction as the topmost surface and formed by the transparent material in the recess, wherein the first-level surface segments and the second-level surface segments are recessed relative to the topmost surface, and wherein the second-level surface segments are elevated relative to the first-level surface segments.

17. The method of claim 16, wherein the first-level surface segments and the second-level surface segments alternate in a periodic pattern from a first sidewall of the first wafer in the recess to a second sidewall of the first wafer in the recess, and wherein the first and second sidewalls are respectively on opposite sides of the recess and extend from the topmost surface.

18. the method of claim 14, wherein the providing comprises forming the first alignment mark, the forming of the first alignment mark comprising:
  performing a first etch into the transparent material to form a plurality of openings evenly spaced with line-shaped top geometries extending in parallel, wherein the openings extend into the first wafer to a first depth and are separated from each other by a plurality of top-surface segments of the transparent material, and wherein the top-surface segments are level with the topmost surface of the first wafer upon completion of the first etch; and after the first etch, recessing the top-surface segments to a second depth greater than the first depth.

19. The method of claim 14, wherein the bonding comprises filling the recess with an epoxy to completely cover the uneven surface in the recess, wherein a thickness of the epoxy varies between at least two different heights from a first side of the first alignment mark to a second side of the first alignment mark opposite the first side upon completion of the bonding, and wherein the at least two different heights are greater than a non-zero height of the epoxy outside the recess upon completion of the bonding.

20. The method of claim 16, wherein each of the first-level surface segments is coupled to a neighboring one of the second-level surface segments by a sidewall extending from that first-level surface segment to the neighboring one of the second-level surface segments.

* * * * *